(12) United States Patent
Yoshimura et al.

(10) Patent No.: US 9,577,160 B2
(45) Date of Patent: Feb. 21, 2017

(54) LIGHT-EMITTING DEVICE AND IMAGE DISPLAY

(71) Applicant: Sharp Kabushiki Kaisha, Osaka-shi, Osaka (JP)

(72) Inventors: Kenichi Yoshimura, Osaka (JP); Tatsuya Ryohwa, Osaka (JP); Makoto Izumi, Osaka (JP); Junichi Kinomoto, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/973,604

(22) Filed: Dec. 17, 2015

(65) Prior Publication Data
US 2016/0315230 A1 Oct. 27, 2016

(30) Foreign Application Priority Data

Apr. 21, 2015 (JP) ................................. 2015-087081

(51) Int. Cl.
*H01L 33/00* (2010.01)
*H01L 33/50* (2010.01)
*H01L 27/15* (2006.01)
*H01L 33/56* (2010.01)

(52) U.S. Cl.
CPC .......... *H01L 33/504* (2013.01); *H01L 27/156* (2013.01); *H01L 33/56* (2013.01)

(58) Field of Classification Search
CPC ........ H01L 33/504; H01L 33/56; H01L 33/06; H01L 33/156; H01L 33/32; H01L 33/502; H01L 27/156; H01L 27/14696; H01L 27/15601

See application file for complete search history.

(56) References Cited

U.S. PATENT DOCUMENTS

| | | | | |
|---|---|---|---|---|
| 9,337,391 B2* | 5/2016 | Jean | ...................... | H01L 33/325 |
| 2008/0048199 A1* | 2/2008 | Ng | .......................... | H01L 33/54 |
| | | | | 257/98 |
| 2010/0091215 A1* | 4/2010 | Fukunaga | ............ | C09K 11/664 |
| | | | | 349/61 |
| 2014/0264418 A1* | 9/2014 | Murphy | ................ | H01L 33/502 |
| | | | | 257/98 |
| 2016/0043279 A1* | 2/2016 | Jean | ...................... | H01L 33/325 |
| | | | | 257/13 |
| 2016/0093776 A1* | 3/2016 | Setlur | .................. | C09K 11/617 |
| | | | | 257/98 |

FOREIGN PATENT DOCUMENTS

| | | |
|---|---|---|
| JP | 2010093132 A | 4/2010 |
| JP | 2011142336 A | 7/2011 |
| JP | 2012163936 A | 8/2012 |
| JP | 2013519232 A | 5/2013 |
| JP | 2013534042 A | 8/2013 |
| WO | 2009110285 A1 | 9/2009 |

* cited by examiner

*Primary Examiner* — Nikolay Yushin
(74) *Attorney, Agent, or Firm* — Alleman Hall McCoy Russell & Tuttle LLP

(57) ABSTRACT

A light-emitting device includes a light-emitting element emitting blue light, a green phosphor emitting green light when being excited by the blue light, and a red phosphor emitting red light when being excited by the blue light. An emission spectral peak wavelength of the green light emitted by the green phosphor is greater than or equal to 520 nm and less than or equal to 540 nm.

13 Claims, 13 Drawing Sheets

FIG. 6

| Semiconductor Light Emitting Device Example | Red Phosphor | Green Phosphor | | | Semiconductor Light-Emitting Device Chromacity Coordinates | |
|---|---|---|---|---|---|---|
| | Weight Ratio (%) of Red Phosphor to 100 wt% Resin | Phosphor Preparation Example | Peak Wavelength (nm) | Half Width (nm) | Weight ratio (%) of Quantum Dot Dispersed Solution to 100 wt% Resin Compound (Resin + Red Phosphor) | CIEx | CIEy |
| Example D1-1 | 15.9 | Preparation Ex. QD1-1 | 525 | 25 | 10.0 | 0.258 | 0.215 |
| Example D1-2 | 15.8 | Preparation Ex. QD1-2 | 525 | 35 | 10.7 | 0.259 | 0.217 |
| Example D1-3 | 15.8 | Preparation Ex. QD1-3 | 525 | 45 | 11.7 | 0.260 | 0.220 |
| Example D2-1 | 13.4 | Preparation Ex. QD2-1 | 535 | 25 | 9.7 | 0.255 | 0.222 |
| Example D2-2 | 13.9 | Preparation Ex. QD2-2 | 535 | 35 | 10.3 | 0.256 | 0.224 |
| Example D2-3 | 13.1 | Preparation Ex. QD2-3 | 535 | 45 | 11.1 | 0.259 | 0.226 |
| Comparative Example D1-1 | 18.9 | Comparative Preparation Example QD1-1 | 515 | 25 | 11.9 | 0.263 | 0.211 |
| Comparative Example D1-2 | 18.9 | Comparative Preparation Example QD1-2 | 515 | 35 | 12.8 | 0.263 | 0.215 |
| Comparative Example D1-3 | 18.9 | Comparative Preparation Example QD1-3 | 515 | 45 | 13.9 | 0.263 | 0.218 |
| Comparative Example D2-1 | 10.6 | Comparative Preparation Example QD2-1 | 545 | 25 | 10.4 | 0.255 | 0.233 |
| Comparative Example D2-2 | 10.5 | Comparative Preparation Example QD2-2 | 545 | 35 | 10.8 | 0.258 | 0.233 |
| Comparative Example D2-3 | 10.3 | Comparative Preparation Example QD2-3 | 545 | 45 | 11.5 | 0.260 | 0.234 |

FIG. 12

| | Semi-conductor LED | Green Phosphor | | | Adobe RGB Cov (%) | Image Display White Point | | | Image Display Red Point | | Image Display Green Point | | Image Display Blue Point | |
|---|---|---|---|---|---|---|---|---|---|---|---|---|---|---|
| | | Preparation Example | Peak W/L (nm) | Half Width (nm) | | Color Tmp (K) | CIEx | CIEy | CIEx | CIEy | CIEx | CIEy | CIEx | CIEy |
| Ex DIS1-1 | Ex D1-1 | Pr Ex QD1-1 | 525 | 25 | 98.0 | 10009.3 | 0.281 | 0.288 | 0.681 | 0.297 | 0.156 | 0.750 | 0.151 | 0.086 |
| Ex DIS1-2 | Ex D1-2 | Pr Ex QD1-2 | | 35 | 96.5 | 10001.7 | 0.281 | 0.288 | 0.681 | 0.297 | 0.169 | 0.729 | 0.149 | 0.086 |
| Ex DIS1-3 | Ex D1-3 | Pr Ex QD1-3 | | 45 | 95.0 | 10003.7 | 0.281 | 0.288 | 0.681 | 0.297 | 0.183 | 0.707 | 0.148 | 0.086 |
| Ex DIS2-1 | Ex D2-1 | Pr Ex QD2-1 | 535 | 25 | 98.8 | 10012.4 | 0.281 | 0.288 | 0.679 | 0.296 | 0.213 | 0.733 | 0.155 | 0.064 |
| Ex DIS2-2 | Ex D2-2 | Pr Ex QD2-2 | | 35 | 97.3 | 10015.5 | 0.281 | 0.288 | 0.678 | 0.296 | 0.220 | 0.719 | 0.154 | 0.067 |
| Ex DIS2-3 | Ex D2-3 | Pr Ex QD2-3 | | 45 | 95.3 | 10015.9 | 0.281 | 0.288 | 0.677 | 0.297 | 0.229 | 0.702 | 0.152 | 0.070 |
| C Ex DIS1-1 | C Ex D1-1 | C Pr Ex QD1-1 | 515 | 25 | 86.4 | 10009.2 | 0.281 | 0.288 | 0.684 | 0.298 | 0.107 | 0.722 | 0.142 | 0.110 |
| C Ex DIS1-2 | C Ex D1-2 | C Pr Ex QD1-2 | | 35 | 85.8 | 10021.5 | 0.280 | 0.288 | 0.683 | 0.298 | 0.125 | 0.703 | 0.142 | 0.107 |
| C Ex DIS1-3 | C Ex D1-3 | C Pr Ex QD1-3 | | 45 | 85.7 | 10064.3 | 0.280 | 0.288 | 0.683 | 0.298 | 0.143 | 0.686 | 0.142 | 0.104 |
| C Ex DIS2-1 | C Ex D2-1 | C Pr Ex QD2-1 | 545 | 25 | 85.2 | 10006.5 | 0.281 | 0.288 | 0.674 | 0.295 | 0.272 | 0.694 | 0.157 | 0.048 |
| C Ex DIS2-2 | C Ex D2-2 | C Pr Ex QD2-2 | | 35 | 84.7 | 10019.7 | 0.281 | 0.288 | 0.672 | 0.296 | 0.275 | 0.687 | 0.156 | 0.052 |
| C Ex DIS2-3 | C Ex D2-3 | C Pr Ex QD2-3 | | 45 | 84.2 | 10018.8 | 0.281 | 0.288 | 0.669 | 0.300 | 0.278 | 0.677 | 0.155 | 0.056 |
| C Ex ISB1 | C Ex ISB1 | C Pr Ex B1 | 539 | 51 | 88.0 | 10053.4 | 0.280 | 0.288 | 0.664 | 0.307 | 0.262 | 0.680 | 0.153 | 0.065 |

Abbreviations
Semiconductor LED  Semiconductor Light-Emitting Device    Peak W/L          Peak Wavelength
Ex                 Example                                 Adobe RGB Cov     Adobe RGB Coverage (%)
C Ex               Comparative Example                     Color Tmp (K)     Color Temperature (K)
Pr Ex              Preparation Example
C Pr Ex            Comparative Preparation Example

FIG. 14

| Semiconductor LED | | Green Phosphor | | | Brightness on Screen (%) (Relative Value) |
|---|---|---|---|---|---|
| | Preparation Example | Peak Wavelength (nm) | Half Width (nm) | | |
| Example DIS1-1 | Preparation Ex QD1-1 | 525 | 25 | | 100.0 |
| Example DIS1-2 | Preparation Ex QD1-2 | 525 | 35 | | 100.0 |
| Example DIS1-3 | Preparation Ex QD1-3 | 525 | 45 | | 99.9 |
| Example DIS2-1 | Preparation Ex QD2-1 | 535 | 25 | | 103.6 |
| Example DIS2-2 | Preparation Ex QD2-2 | 535 | 35 | | 103.1 |
| Example DIS2-3 | Preparation Ex QD2-3 | 535 | 45 | | 102.7 |
| Comparative Ex DIS1-1 | C Pr Example QD1-1 | 515 | 25 | | 91.3 |
| Comparative Ex DIS1-2 | C Pr Example QD1-2 | 515 | 35 | | 92.6 |
| Comparative Ex DIS1-3 | C Pr Example QD1-3 | 515 | 45 | | 94.0 |

Abbreviations
Semiconductor LED   Semiconductor Light-Emitting Device
Comparative Ex      Comparative Example
Preparation Ex      Preparation Example
C Pr Example        Comparative Preparation Example

LIGHT-EMITTING DEVICE AND IMAGE DISPLAY

BACKGROUND

Technical Field

The present disclosure relates to a light-emitting device including a light-emitting element and a wavelength conversion member and to an image display including the light-emitting device.

Background Art

There has been recently developed a light-emitting device that includes a combination of (i) a semiconductor light-emitting element such as a light-emitting diode (LED) and (ii) a wavelength conversion member (for example, a member in which phosphor particles are dispersed into a resin) that converts excitation light from the semiconductor light-emitting element into phosphorescence. The light-emitting device has a small size and has the advantage of consuming lower power than an incandescent light bulb. Accordingly, the light-emitting device is practically employed as a light source for a variety of image displays or for illumination devices.

A general type of such a light-emitting device employed includes a combination of a blue LED and a yellow phosphor. A Ce-activated yttrium aluminum garnet (YAG) phosphor is widely employed for the yellow phosphor because of a high luminous efficiency.

In the case of employing the light-emitting device as an image display, the color reproduction range of the image display widens as the emission spectral half width of the phosphor decreases. However, the emission spectral half width of the Ce-activated YAG phosphor is comparatively large, about 100 nm. Therefore, the width of the color reproduction range is insufficient when a semiconductor light-emitting device employing the Ce-activated YAG phosphor for the yellow phosphor is configured as a liquid crystal backlight of the image display.

Specifically, the image display can cover almost the entire standard red green blue (sRGB) color gamut that is employed in a cathode ray tube (CRT). However, the coverage remarkably decreases with respect to the Adobe RGB color gamut that is employed in a wide color gamut liquid crystal display.

More specifically, when the semiconductor light-emitting device employing the Ce-activated YAG yellow phosphor is employed as the liquid crystal backlight of the image display, the color gamut of the image display has a coverage of about 70% with respect to the Adobe RGB color gamut. Therefore, the semiconductor light-emitting device is not suitable for use in the wide color gamut liquid crystal display.

The sRGB color gamut is defined by a triangle that is formed by three chromaticity points of (CIEx, CIEy)= (0.640, 0.330), (0.300, 0.600), (0.150, 0.060) on the Commission Internationale de l'Eclairage (CIE) 1931 chromaticity coordinate plane.

On the other hand, the Adobe RGB color gamut is defined by a triangle that is formed by three chromaticity points of (CIEx, CIEy)=(0.640, 0.330), (0.210, 0.710), (0.150, 0.060) on the CIE 1931 chromaticity coordinate plane. The Adobe RGB color gamut has a wide green color reproduction range when compared with the sRGB color gamut.

A semiconductor light-emitting device compatible with Adobe RGB and suitable for use as the backlight of the wide color gamut liquid crystal display is configured to employ a combination of two different colored phosphors of a green phosphor and a red phosphor. It is desirable that the emission spectral half widths of those phosphors are narrow.

In International Publication No. WO 2009/110285 (published on Sep. 11, 2009) and Japanese Unexamined Patent Application Publication No. 2010-93132 (published on Apr. 22, 2010), there is disclosed a semiconductor light-emitting device that employs a combination of an Eu-activated β-SiAlON phosphor and an $Mn^{4+}$-activated fluoride complex as a phosphor. According to the combination when configured in the image display, a wide color reproduction range can be realized in comparison with a configuration employing the yellow phosphor as a phosphor.

This results from the fact that the emission spectral half width of the Eu-activated β-SiAlON phosphor and the half width of the $Mn^{4+}$-activated fluoride complex phosphor are narrower than that of the Ce-activated YAG phosphor. Specifically, the emission spectral half width of the Eu-activated β-SiAlON phosphor is less than or equal to 55 nm. The half width of the $Mn^{4+}$-activated fluoride complex phosphor is less than or equal to 10 nm.

The emission spectral half width of the Eu-activated β-SiAlON phosphor is less than or equal to 55 nm and is narrower than the emission spectral half width of the Ce-activated YAG yellow phosphor. However, combining the Eu-activated β-SiAlON phosphor with a phosphor having a narrower emission spectral half width can additionally realize an image display having a further wider color reproduction range.

In Japanese Unexamined Patent Application Publication No. 2011-142336 (published on Jul. 21, 2011), there is disclosed a configuration that includes a combination of a blue LED and two types of quantum dot phosphors emitting green and red light. However, in the configuration disclosed in Japanese Unexamined Patent Application Publication No. 2011-142336 (published on Jul. 21, 2011), the red light emitting quantum dot phosphor absorbs the green light of the green light emitting quantum dot phosphor. This poses a problem in that the luminous efficiency of the light-emitting device decreases remarkably.

In Japanese Unexamined Patent Application Publication No. 2012-163936 (published on Aug. 30, 2012), Japanese Unexamined Patent Application Publication (Translation of PCT Application) No. 2013-519232 (published on May 23, 2013), and Japanese Unexamined Patent Application Publication (Translation of PCT Application) No. 2013-534042 (published on Aug. 29, 2013), there is disclosed a configuration that employs a combination of a quantum dot phosphor and the $Mn^{4+}$-activated fluoride complex phosphor as the phosphor dispersed into the wavelength conversoin member. The $Mn^{4+}$-activated fluoride complex phosphor does not absorb green light, unlike the quantum dot phosphor. Therefore, according to the configuration disclosed in Japanese Unexamined Patent Application Publication No. 2012-163936 (published on Aug. 30, 2012), Japanese Unexamined Patent Application Publication (Translation of PCT Application) No. 2013-519232 (published on May 23, 2013), and Japanese Unexamined Patent Application Publication (Translation of PCT Application) No. 2013-534042 (published on Aug. 29, 2013), the problem of the red light emitting phosphor absorbing the green light emitted by the green light emitting phosphor is resolved.

However, a configuration suitable for realizing the image display having a wide color reproduction range with the light-emitting device including a combination of the $Mn^{4+}$-activated fluoride complex phosphor and the quantum dot phosphor is not disclosed in any of Japanese Unexamined Patent Application Publication No. 2012-163936 (published on Aug. 30, 2012), Japanese Unexamined Patent Application Publication (Translation of PCT Application) No. 2013-519232 (published on May 23, 2013), and Japanese Unexamined Patent Application Publication (Translation of PCT Application) No. 2013-534042 (published on Aug. 29, 2013).

SUMMARY

It is desirable to provide a light-emitting device enabling realization of an image display having a wide color reproduction range and to provide an image display including the light-emitting device.

In order to resolve the above problem, according to an aspect of the present disclosure, there is provided a light-emitting device including a light-emitting element emitting blue light, a quantum dot phosphor emitting green light when being excited by the blue light, and an $Mn^{4+}$-activated fluoride complex phosphor emitting red light when being excited by the blue light. The emission spectral peak wavelength of the green light emitted by the quantum dot phosphor is greater than or equal to 520 nm and less than or equal to 540 nm.

BRIEF DESCRIPTION OF THE DRAWINGS

FIG. 6 is a table illustrating parameters of the light-emitting device according to each of the examples and comparative examples of the first embodiment;

FIG. 12 is a table illustrating parameters of the image display according to each of the examples and comparative examples of the second embodiment;

FIG. 14 is a table illustrating the brightness of the image display of each of the examples and comparative examples.

DESCRIPTION OF THE EMBODIMENTS

First Embodiment

A first embodiment will be described as follows on the basis of FIG. 1 to FIG. 9B. In the present embodiment, a description will be provided of a light-emitting device that enables realization of an image display having a high luminous efficiency and a wide color reproduction range when being employed as backlight of the image display.

Light-Emitting Device 10

Figure 1:
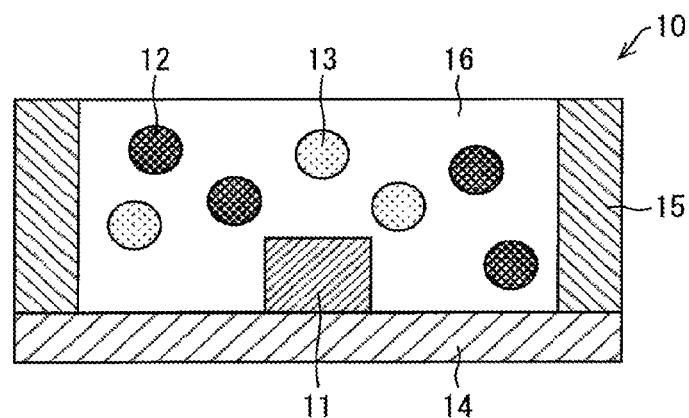
FIG. 1 is a sectional view illustrating a light-emitting device according to a first embodiment.

FIG. 1 is a sectional view illustrating a light-emitting device 10 that is an example of the light-emitting device according to the present embodiment. As illustrated in FIG. 1, the light-emitting device 10 includes a light-emitting element 11, a red phosphor 12, a green phosphor 13, a printed wiring board 14, a resin frame 15, and a dispersion material 16.

Light-Emitting Element 11

The light-emitting element 11 is a light-emitting element that emits blue light. The light-emitting element 11 is not particularly limited provided that the light-emitting element 11 emits primary light (excitation light) that causes the later-described red phosphor 12 and the green phosphor 13 to exhibit fluorescence when being absorbed thereinto. A gallium nitride (GaN)-based semiconductor, for example, can be employed for the light-emitting element 11.

The peak wavelength of the primary light (excitation light) emitted from the light-emitting element 11 is preferably greater than or equal to 420 nm and less than or equal to 480 nm and more preferably greater than or equal to 440 nm and less than or equal to 460 nm. The luminous efficiency of the light-emitting element 11 is high when the peak wavelength of the primary light (excitation light) is within a range of greater than or equal to 420 nm and less than or equal to 480 nm. When the peak wavelength of the primary light (excitation wavelength) is greater than or equal to 440 nm and less than or equal to 460 nm, the light-emitting element 11 has a particularly high luminous efficiency, and favorable wavelength consistency is attained between the excitation spectrum of the red phosphor 12 and the transmission spectrum of a blue color filter 126b described later. Therefore, the luminous efficiency of the light-emitting device 10 can be increased.

Red Phosphor 12

The red phosphor 12 is an $Mn^{4+}$-activated fluoride complex phosphor that emits red light when being excited by blue light emitted from the light-emitting element 11. The emission spectral half width of the red light emitted by the $Mn^{4+}$-activated fluoride complex phosphor is very narrow, less than or equal to 10 nm. Accordingly, the light-emitting device 10 according to the present embodiment has excellent color reproducibility in the red region.

A phosphor represented by the following general formula (A) or general formula (B), for example, can be employed for the $Mn^{4+}$-activated fluoride complex phosphor employed as the red phosphor 12. Even the $Mn^{4+}$-activated fluoride complex phosphor represented by either the general formula (A) or the general formula (B) has a very narrow emission spectral half width of less than or equal to 10 nm as described above. This is due to the properties of $Mn^{4+}$ which is a light-emitting ion.

  General Formula (A):

In the general formula (A), MI is at least one alkaline metal element selected from a group consisting of Li, Na, K, Rb, and Cs. MII is at least one tetravalent metal element selected from a group consisting of Ge, Si, Sn, Ti, and Zr. It is desirable that $0.001 \leq h \leq 0.1$.

In the general formula (A), it is desirable that MI is K from the viewpoint of high luminous intensity and high stability of the phosphor crystal. In addition, for the same reason, it is desirable that MII includes Ti or Si.

In the general formula (A), the value of h represents a composition ratio (concentration) of Mn, that is, concentration of $Mn^{4+}$. When the value of h is less than 0.001, this poses a problem in that sufficient brightness is not obtained because of insufficient concentration of $Mn^{4+}$ which is a light-emitting ion. On the other hand, when the value of h exceeds 0.1, this poses a problem in that brightness greatly decreases due to concentration quenching or the like.

That is, it is desirable that the $Mn^{4+}$-activated fluoride complex phosphor represented by the general formula (A) is either $K_2(Ti_{1-h}Mn_h)F_6$ or $K_2(Si_{1-h}Mn_h)F_6$ and that h is greater than or equal to 0.001 and less than or equal to 0.1.

$$MIII(MII_{1-h}Mn_h)F_6 \quad \text{General Formula (B):}$$

In the general formula (B), MIII is at least one alkaline earth metal element selected from a group consisting of Mg, Ca, Sr, and Ba. MII is at least one tetravalent metal element selected from a group consisting of Ge, Si, Sn, Ti, and Zr. It is desirable that $0.001 \leq h \leq 0.1$.

In the general formula (B), it is desirable that MIII includes at least Ba from the viewpoint of a high luminous efficiency of the phosphor and less degradation thereof due to heat and external forces. For this same reason, it is desirable that MII includes Ti or Si.

Particularly, even when the $Mn^{4+}$-activated fluoride complex phosphor is represented by either the general formula (A) or the general formula (B), it is more desirable that MII is Si because of the low water solubility and high water-resistance of the phosphor. In addition, in the general formula (B), it is desirable that the value of h representing a composition ratio (concentration) of Mn is the same as h of the general formula (A), $0.001 \leq h \leq 0.1$.

Green Phosphor 13

A configuration employing a quantum dot phosphor for a green phosphor is taken into consideration so as to widen the green color reproduction range from that of a semiconductor light-emitting device disclosed in International Publication No. WO 2009/110285 (published on Sep. 11, 2009) and Japanese Unexamined Patent Application Publication No. 2010-93132 (published on Apr. 22, 2010). The emission spectral half width of the quantum dot phosphor can be theoretically decreased up to about 15 nm by making the particle diameters of quantum dots uniform. In addition, the green phosphor having a narrow linewidth and a half width of about less than or equal to 40 nm has been previously realized.

In the present embodiment, the green phosphor 13 is a quantum dot phosphor that emits green light when being excited by blue light emitted from the light-emitting element 11. The emission spectral peak wavelength of the green light emitted by the green phosphor 13 is greater than or equal to 520 nm and less than or equal to 540 nm.

When the emission spectral peak wavelength of the green phosphor 13 is less than 520 nm or exceeds 540 nm, the color reproduction range of the image display, such as the coverage with respect to the Adobe RGB color gamut, decreases when the light-emitting device 10 is employed as backlight of the image display.

Accordingly, employing the quantum dot phosphor for the green phosphor can widen the green color reproduction range further than the combination of International Publication No. WO 2009/110285 (published on Sep. 11, 2009) or Japanese Unexamined Patent Application Publication No. 2010-93132 (published on Apr. 22, 2010) in which the emission spectral half width of the green phosphor is about 55 nm.

It is desirable that the emission spectral half width of the green phosphor 13 is as narrow as possible from the viewpoint of widening the color reproduction range of the image display. However, in order to narrow the emission spectral half width of the quantum dot phosphor, it is necessary to reduce the variation of the particle diameters in the preparation of quantum dots. In this case, quantum dots residing outside an allowable range of particle diameter variation may not be employed for the green phosphor.

As a result, the manufacturing yield of the quantum dot phosphor decreases, and cost increases by a corresponding amount. Therefore, narrowing the half width of the quantum dot phosphor has the problem of lacking practical usability.

Thus, the emission spectral half width of the green light emitted by the green phosphor 13 is greater than or equal to 25 nm in the present embodiment. If the green phosphor 13 is designed as such, the allowable range of particle diameter variation is widened in the preparation of the green phosphor 13. As a result, this increases the manufacturing yield of the green phosphor 13 and lowers the manufacturing cost of the green phosphor 13, and furthermore, the manufacturing cost of the light-emitting device 10.

As described above, the emission spectral half width of the red phosphor 12 is very narrow, less than or equal to 10 nm in the present embodiment. Therefore, even if the emission spectral half width of the green phosphor 13 is widened, the emission spectrum of the green phosphor 13 overlaps less with the emission spectrum of the red phosphor 12. Thus, the image display employing the light-emitting device 10 is unlikely to have a decrease in color reproducibility. That is, an image display having high color reproducibility can be realized even if the emission spectral half width of the green phosphor 13 is limited to greater than or equal to 25 nm.

Figure 2:
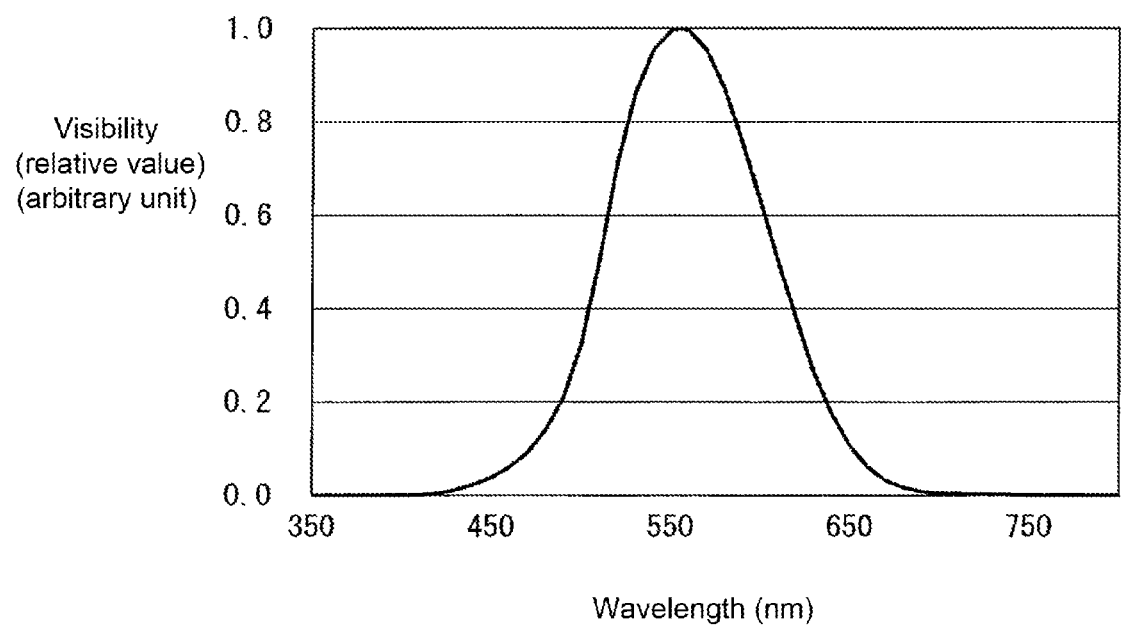
FIG. 2 is a graph illustrating a visibility curve of a human being.

FIG. 2 is a graph illustrating a visibility curve of a human being. The peak wavelength of the green light emitted by the green phosphor 13 is greatly separated from the peak wavelength of the visibility curve of a human being illustrated in FIG. 2 when the emission spectral peak wavelength of the green phosphor 13 is less than 520 nm. Therefore, the luminous efficiency of the light-emitting device 10 decreases.

It is desirable that a crystalline semiconductor material constituting the quantum dot phosphor is a phosphor material that can efficiently emit visible light. Examples of such a material include a group II-VI compound semiconductor, a group III nitride semiconductor, and a chalcopyrite material. More specifically, CdSe, CdS, CdTe, InP, InN, AlInN, InGaN, AlGaInN, and CuInGaSe are exemplified.

The energy band gap of the quantum dot phosphor can be adjusted to produce various wavelengths of fluorescence by adjusting the particle diameter or material composition of the quantum dot phosphor.

Other Members Constituting Light-Emitting Device 10

The printed wiring board 14 is a board on which an electrical circuit driving the light-emitting element 11 is formed along with the light-emitting element 11 mounted thereon. The resin frame 15 is a frame made of resin and mounted on the printed wiring board 14.

The dispersion material 16 is a member that seals the light-emitting element 11. The red phosphor 12 and the green phosphor 13 are dispersed into the dispersion material 16. The inside of the resin frame 15 is filled with the dispersion material 16.

The red phosphor 12 absorbs the green light emitted by the green phosphor 13 when the green phosphor 13 is dispersed into the same dispersion material as the red phosphor 12 in a case where the red phosphor 12 is, for example, a quantum dot phosphor. This poses a problem in that the luminous efficiency of the light-emitting device decreases remarkably.

The red phosphor 12 according to the present embodiment is an $Mn^{4+}$-activated fluoride complex phosphor. The $Mn^{4+}$-activated fluoride complex phosphor does not absorb green light. Thus, the above problem does not arise even if the green phosphor 13 is dispersed into the same dispersion material as the red phosphor 12. Therefore, the structure of the light-emitting device 10 can be simplified by dispersing the red phosphor 12 and the green phosphor 13 into one single dispersion material.

While the material constituting the dispersion material 16 is not particularly limited, a resin material such as a methyl-based silicone resin, a phenyl-based silicone resin, an epoxy resin, or an acrylic resin; a glass material such as a low melting glass; or an organic-inorganic hybrid glass can be appropriately employed. Particularly, when the dispersion material 16 comprises a resin material, it is desirable that the temperature of the dispersion material 16 in the preparation thereof be low when compared to those of other materials.

When the dispersion material 16 is, for example, a methyl-based silicone resin, it is desirable that the green phosphor 13 is mixed at a mixing ratio as a weight ratio ranging from 1 wt % to 30 wt % with respect to 100% of the methyl-based silicone resin. It is more desirable that the green phosphor 13 is mixed at a mixing ratio as a weight ratio ranging from 5 wt % to 20 wt % with respect to 100% of the methyl-based silicone resin.

On the other hand, it is desirable that the red phosphor 12 is mixed at a mixing ratio as a weight ratio ranging from 1 wt % to 60 wt % with respect to the methyl-based silicone resin. It is more desirable that the red phosphor 12 is mixed at a mixing ratio as a weight ratio ranging from 5 wt % to 30 wt % with respect to the methyl-based silicone resin.

The concentration of the green phosphor 13 and the red phosphor 12 is suitably dense for emitting green light and red light by mixing the green phosphor 13 and the red phosphor 12 within the above weight ratio ranges.

Preparation Example of Red Phosphor 12

Figure 3:
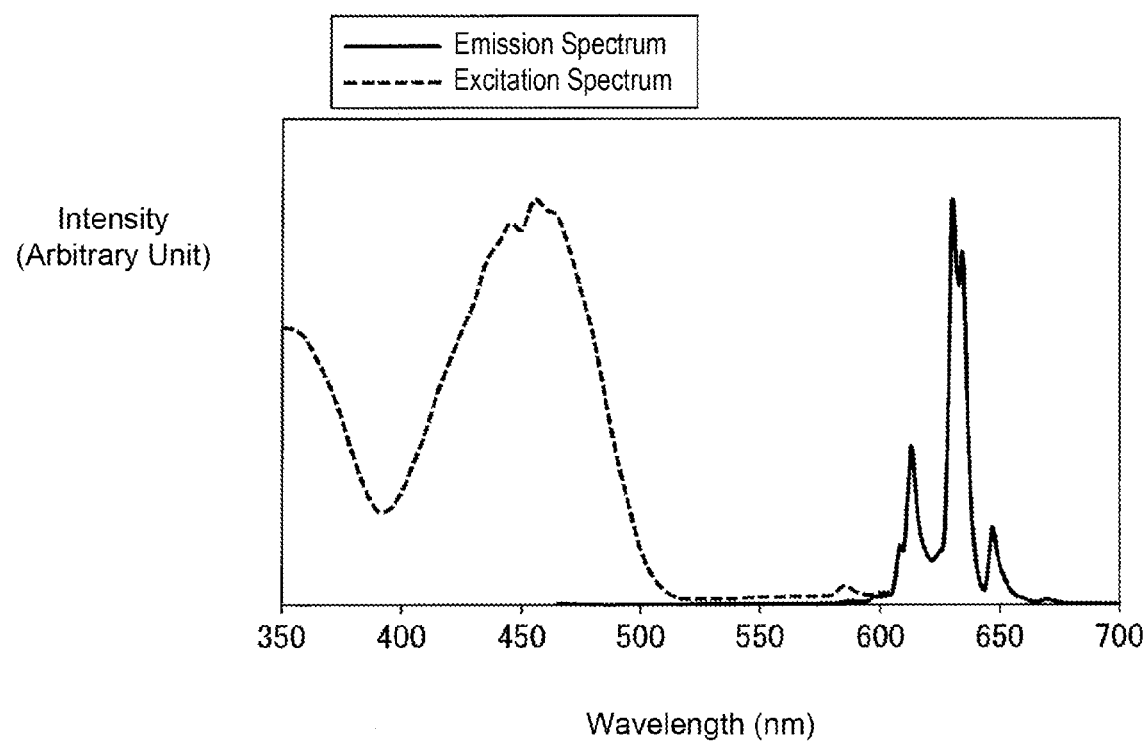
FIG. 3 is a graph illustrating an emission spectrum and an excitation spectrum of a red phosphor.

A preparation example of the red phosphor 12 will be described with reference to FIG. 3. FIG. 3 is a graph illustrating an emission spectrum and an excitation spectrum of the red phosphor 12.

Preparation Example R1

Example of Preparing $Mn^{4+}$-Activated Fluoride Complex Phosphor

An $Mn^{4+}$-activated fluoride complex phosphor represented by the general formula (A) where MI is K, MII is Si, and h=0.06 is prepared in the following procedure.

First, a partition (diaphragm) of a fluorinated resin-based ion exchange membrane is disposed at the center of a polyvinyl resin reaction chamber, and an anode and a cathode, both of which are platinum plates, are installed in each of two chambers between which the ion exchange membrane is interposed. A hydrofluoric acid aqueous solution in which a manganese (II) fluoride is dissolved is put into the anode side of the reaction chamber, and a hydrofluoric acid aqueous solution is put into the cathode side thereof.

The anode and the cathode are connected to a power supply, and the aqueous solutions are electrolyzed at a voltage of 3 V and at a current of 0.75 A. After electrolysis is finished, $K_2MnF_6$ is produced as a yellow solid product by excessively adding a solution of a potassium fluoride saturated in a hydrofluoric acid aqueous solution to the reaction solution on the anode side. $K_2MnF_6$ is obtained by separating and collecting the solid product through filtration.

Next, an aqueous solution including a silicon fluoride is prepared by dissolving 4.8 g of a silicon dioxide in 100 $cm^3$ of a 48 wt % hydrofluoric acid aqueous solution. The aqueous solution is cooled down to room temperature and then is put into a lidded resin container. The container is maintained for one hour or more in 70° C. water to heat the aqueous solution. Then, 1.19 g of the $K_2MnF_6$ powder is added to the aqueous solution including a silicon fluoride and is stirred thereinto until the powder is dissolved to prepare an aqueous solution including a silicon fluoride and $K_2MnF_6$ (first solution).

In addition, an aqueous solution including a potassium fluoride (second solution) is prepared by dissolving 13.95 g of a potassium fluoride in 40 $cm^3$ of a 48 wt % hydrofluoric acid aqueous solution and cooling the solution down to room temperature.

Then, a light orange solid is produced by adding the second solution slightly to the stirred first solution for about 2.5 minutes and stirring the first solution for about 10 minutes. The solid product is separated through filtration, and the separated solid product is washed with a small amount of a 20 wt % hydrofluoric acid aqueous solution. Then, the solid product is further washed with ethanol and is dried in a vacuum. As a result, 15.18 g of an $Mn^{4+}$-activated fluoride complex phosphor is obtained.

The production of a $K_2SiF_6$ phase is confirmed by inspecting an X-ray diffraction pattern of the $Mn^{4+}$-activated fluoride complex phosphor with an X-ray diffraction device manufactured by Rigaku Corporation employing a K-α line of Cu.

The emission spectrum of the $Mn^{4+}$-activated fluoride complex phosphor is measured. Specifically, first, the $Mn^{4+}$-activated fluoride complex phosphor is tapped to fill a quartz cell of a width 10 mm×a length 10 mm×a depth 50 mm to the highest density. Then, the emission spectrum of the $Mn^{4+}$-activated fluoride complex phosphor in the quartz cell, when being excited by light of a wavelength of 445 nm, is measured by employing a spectrofluorometer (Fluoromax 4 manufactured by Horiba, Ltd.).

As a result of the measurement, the emission spectrum of the $Mn^{4+}$-activated fluoride complex phosphor illustrated by a solid line in FIG. 3 is obtained. As a result of an analysis of the emission spectrum illustrated in FIG. 3, it is confirmed that the $Mn^{4+}$-activated fluoride complex phosphor has an emission spectral peak wavelength of 630 nm and a half width of 8 nm.

In the case of changing the wavelength of excitation light, the excitation spectrum illustrated by a broken line in FIG. 3 is obtained by plotting the luminous intensity of the $Mn^{4+}$-activated fluoride complex phosphor of the peak wavelength 630 nm with the excitation wavelength.

Preparation Example of Quantum Dot Phosphor

Preparation examples of the quantum dot phosphor employed for the green phosphor 13 will be described with reference to FIGS. 4A to 4F. FIGS. 4A to 4F are graphs illustrating an emission spectrum and an excitation spectrum of the quantum dot phosphor prepared by the following preparation examples.

The process of obtaining the quantum dot phosphor is not particularly limited. A known method for preparing the quantum dot phosphor can be employed. From the viewpoints of simplicity, convenience, and low cost, it is desirable to use a chemical synthesis method. With a chemical synthesis method, a target product can be obtained by dispersing a plurality of starting materials, including the elements constituting the product, into a medium and reacting those materials.

Examples of such a chemical synthesis method include a sol-gel method (colloidal method), a hot soap method, a reverse micelle method, a solvothermal method, a molecular precursor method, a hydrothermal synthesis method, and a flux method. From the viewpoint of suitably preparing a semiconductor nanoparticle comprising compound semiconductor materials, it is desirable to employ the hot soap method.

Hereinafter, examples of a method for preparing a quantum dot phosphor comprising a CdSe/ZnS semiconductor nanoparticle including a CdSe core and a ZnS shell will be described by employing the hot soap method.

Preparation Example QD1-1

Quantum Dot of Peak Wavelength 525 nm and Half Width 25 nm

First, a CdSe core is synthesized. A mixed solution is obtained by mixing 1 mmol of a trioctylphosphine selenide (TOPSe) and 1 mmol of dimethylcadmium into 3 ml of trioctylphosphine (TOP) in an inert atmosphere.

Next, 5 g of a trioctylphosphine oxide (TOPO) is put into the mixed solution that is heated to 350° C. in a nitrogen atmosphere. The mixed solution, when the temperature thereof falls to about 260° C., reacts with the TOPO to form a CdSe nanocrystal. After the mixed solution reacts with the TOPO for 60 minutes, the reaction solution is cooled down to room temperature to stop the reaction.

Classification including three processes of (i) extracting a quantum dot phosphor by adding 10 ml of a poor solvent of dehydrated ethanol, (ii) precipitating the quantum dot phosphor by centrifugation at 4,000 rpm for 10 minutes, and (iii) redissolving the quantum dot phosphor by adding dehydrated toluene is performed on the reaction solution 10 times. To sum up the processing conditions, the reaction time is 60 minutes, and classification is performed 10 times.

Next, a ZnS shell is synthesized. 3 ml of a TOP solution including 3 mmol of zinc acetate and 3 mmol of sulphur which are ingredients of the shell layer is added to the CdSe core solution synthesized in the above manner to react at 150° C. for two hours and then is cooled down to room temperature. Accordingly, a CdSe/ZnS quantum dot phosphor can be obtained.

The emission spectrum of the CdSe/ZnS quantum dot prepared in the above procedure (hereinafter, referred to as a quantum dot of Preparation Example QD1-1) is measured. Specifically, first, a quartz cell of a width 10 mm×a length 10 mm×a depth 50 mm is filled with a solution configured by dispersing the quantum dot of Preparation Example QD1-1 into a toluene solution. Then, the emission spectrum of the CdSe/ZnS quantum dot in the quartz cell when being excited by light of a wavelength of 445 nm is measured by employing a spectrofluorometer (Fluoromax 4 manufactured by Horiba, Ltd.).

Figure 4A:
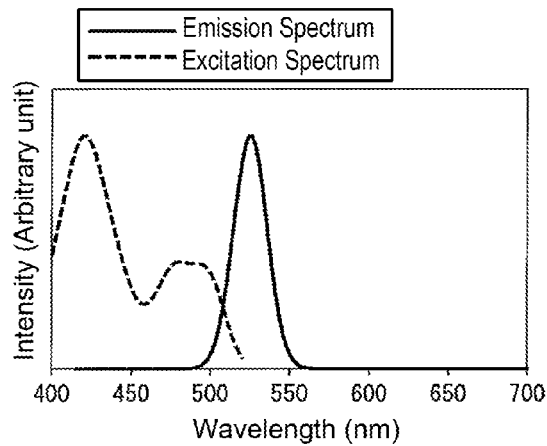
FIGS. 4A to 4F are graphs illustrating an emission spectrum and an excitation spectrum of a green phosphor.

As a result of the measurement, the emission spectrum of the quantum dot phosphor of Preparation Example QD1-1 illustrated by a solid line in FIG. 4A is obtained. As a result of the analysis of the emission spectrum illustrated in FIG. 4A, it is confirmed that the quantum dot phosphor of Preparation Example QD1-1 has an emission spectral peak wavelength of 525 nm and a half width of 25 nm.

In the case of changing the wavelength of excitation light, the excitation spectrum illustrated by a broken line in FIG. 4A is obtained by plotting the luminous intensity of the quantum dot phosphor of Preparation Example QD1-1 of the peak wavelength 525 nm with the changed excitation wavelength.

Preparation Example QD1-2

Quantum Dot of Peak Wavelength 525 nm and Half Width 35 nm

A quantum dot phosphor comprising a CdSe/ZnS semiconductor nanoparticle is prepared in the same manner as Preparation Example QD1-1 by using the hot soap method. In the present preparation example, the reaction time is 60 minutes, and classification is performed five times. Other conditions are the same as those of Preparation Example QD1-1.

Figure 4D:
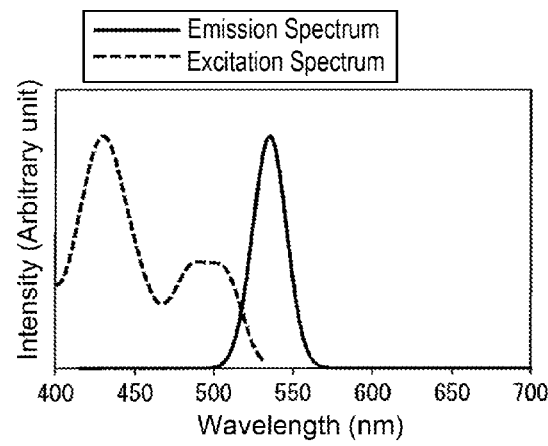
Figure 4B:
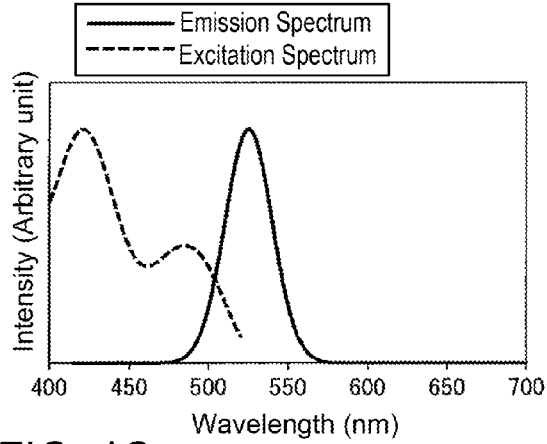

The emission spectrum and the excitation spectrum of the quantum dot of Preparation Example QD1-2 are measured in the same manner as in Preparation Example QD1-1. As a result of the measurement, the emission spectrum and the excitation spectrum of the quantum dot phosphor of Preparation Example QD1-2 illustrated in FIG. 4B are obtained. As a result of the analysis of FIG. 4B, it is confirmed that the quantum dot phosphor obtained in Preparation Example QD1-2 has an emission spectral peak wavelength of 525 nm and a half width of 35 nm.

Preparation Example QD1-3

Quantum Dot of Peak Wavelength 525 nm and Half Width 45 nm

A quantum dot phosphor comprising a CdSe/ZnS semiconductor nanoparticle is prepared in the same manner as in Preparation Example QD1-1 by using the hot soap method. In the present preparation example, the reaction time is 60 minutes, and classification is performed two times. Other conditions are the same as those of Preparation Example QD1-1.

Figure 4E:
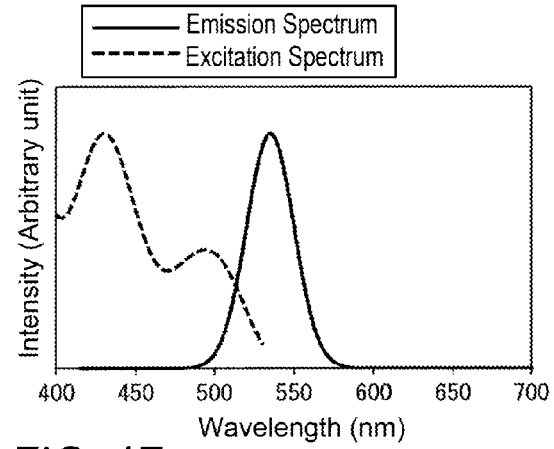
Figure 4C:
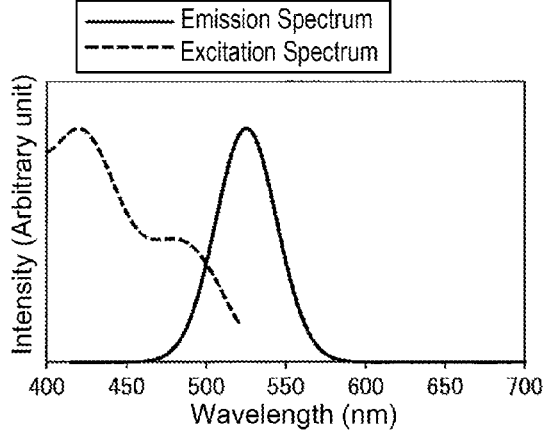

The emission spectrum and the excitation spectrum of the quantum dot of Preparation Example QD1-3 are measured in the same manner as Preparation Example QD1-1. As a result, the emission spectrum and the excitation spectrum of the quantum dot phosphor of Preparation Example QD1-3 illustrated in FIG. 4C are obtained. As a result of the analysis of FIG. 4C, it is confirmed that the quantum dot phosphor obtained in Preparation Example QD1-3 has an emission spectral peak wavelength of 525 nm and a half width of 45 nm.

Preparation Example QD2-1

Quantum Dot of Peak Wavelength 535 nm and Half Width 25 nm

A quantum dot phosphor comprising a CdSe/ZnS semiconductor nanoparticle is prepared in the same manner as Preparation Example QD1-1 by using the hot soap method. In the present preparation example, the reaction time is 70 minutes, and classification is performed 10 times. Other conditions are the same as those of Preparation Example QD1-1.

The emission spectrum and the excitation spectrum of the quantum dot of Preparation Example QD2-1 are measured in the same manner as Preparation Example QD1-1. As a result, the emission spectrum and the excitation spectrum of the quantum dot phosphor of Preparation Example QD2-1 illustrated in FIG. 4D are obtained. As a result of an analysis of FIG. 4D, it is confirmed that the quantum dot phosphor obtained in Preparation Example QD2-1 has an emission spectral peak wavelength of 535 nm and a half width of 25 nm.

Preparation Example QD2-2

Quantum Dot of Peak Wavelength 535 nm and Half Width 35 nm

A quantum dot phosphor comprising a CdSe/ZnS semiconductor nanoparticle is prepared in the same manner as Preparation Example QD1-1 by using the hot soap method. In the present preparation example, the reaction time is 70 minutes, and classification is performed five times. Other conditions are the same as those of Preparation Example QD1-1.

The emission spectrum and the excitation spectrum of the quantum dot of Preparation Example QD2-2 are measured in the same manner as Preparation Example QD1-1. As a result, the emission spectrum and the excitation spectrum of the quantum dot phosphor of Preparation Example QD2-2 illustrated in FIG. 4E are obtained. As a result of the analysis of FIG. 4E, it is confirmed that the quantum dot phosphor obtained in Preparation Example QD2-2 has an emission spectral peak wavelength of 535 nm and a half width of 35 nm.

Preparation Example QD2-3

Quantum Dot of Peak Wavelength 535 nm and Half Width 45 nm

A quantum dot phosphor comprising a CdSe/ZnS semiconductor nanoparticle is prepared in the same manner as Preparation Example QD1-1 by using the hot soap method. In the present preparation example, the reaction time is 70 minutes, and classification is performed two times. Other conditions are the same as those of Preparation Example QD1-1.

Figure 4F:
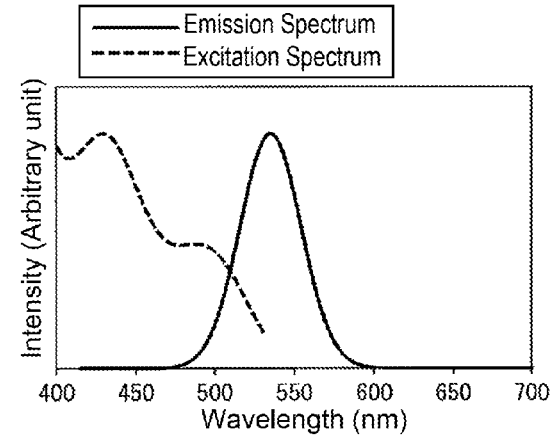

The emission spectrum and the excitation spectrum of the quantum dot of Preparation Example QD2-3 are measured in the same manner as Preparation Example QD1-1. As a result, the emission spectrum and the excitation spectrum of the quantum dot phosphor of Preparation Example QD2-3 illustrated in FIG. 4F are obtained. As a result of the analysis of FIG. 4F, it is confirmed that the quantum dot phosphor obtained in Preparation Example QD2-3 has an emission spectral peak wavelength of 535 nm and a half width of 45 nm.

Comparative Example 1 of Green Phosphor

Preparation examples of a green phosphor for comparison with the green phosphor 13 of the present embodiment will be described with reference to FIGS. 5A to 5F. FIGS. 5A to 5F are graphs illustrating an emission spectrum and an excitation spectrum of the green phosphor in the comparative examples.

Comparative Preparation Example QD1-1

Quantum Dot of Peak Wavelength 515 nm and Half Width 25 nm

For comparison with the green phosphor of the present embodiment, a quantum dot phosphor comprising a CdSe/ZnS semiconductor nanoparticle is prepared in the same manner as Preparation Example QD1-1 by using the hot soap method. In the present comparative preparation example, the quantum dot phosphor of Comparative Preparation Example QD1-1 is prepared under the conditions that the reaction time is 50 minutes and that classification is performed 10 times. Other conditions are the same as those of Preparation Example QD1-1.

Figure 5A:
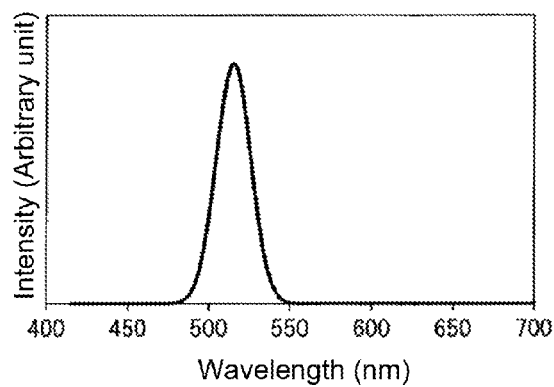
FIGS. 5A to 5F are graphs illustrating an emission spectrum and an excitation spectrum of a green phosphor in the comparative examples.

The emission spectrum of the quantum dot of Comparative Preparation Example QD1-1 is measured in the same manner as Preparation Example QD1-1. As a result, the emission spectrum of the quantum dot phosphor of Comparative Preparation Example QD1-1 illustrated in FIG. 5A is obtained. As a result of the analysis of the emission spectrum illustrated in FIG. 5A, it is confirmed that the quantum dot phosphor obtained in Comparative Preparation Example QD1-1 has an emission spectral peak wavelength of 515 nm and a half width of 25 nm.

Comparative Preparation Example QD1-2

Quantum Dot of Peak Wavelength 515 nm and Half Width 35 nm

A quantum dot phosphor comprising a CdSe/ZnS semiconductor nanoparticle is prepared in the same manner as Comparative Preparation Example QD1-1 by using the hot soap method. In the present comparative preparation example, the reaction time is 50 minutes, and classification is performed five times. Other conditions are the same as those of Preparation Example QD1-1.

Figure 5D:
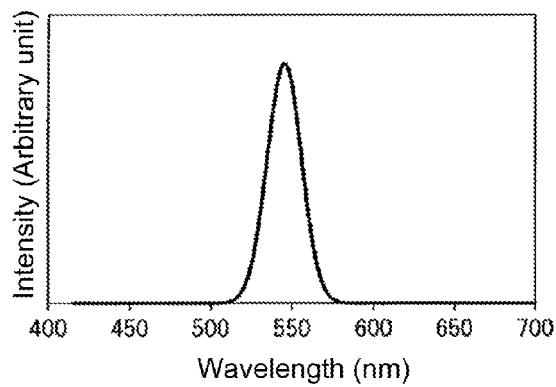
Figure 5B:
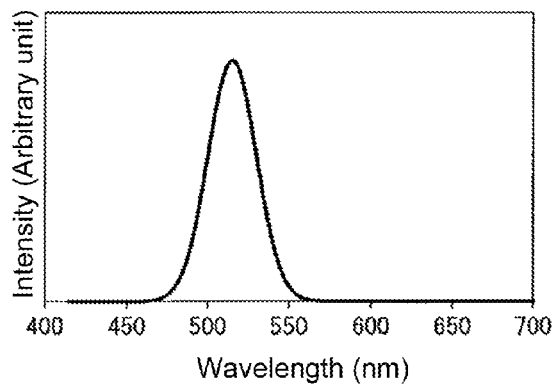

The emission spectrum of the quantum dot of Comparative Preparation Example QD1-2 is measured in the same manner as Preparation Example QD1-1. As a result, the emission spectrum of the quantum dot phosphor of Comparative Preparation Example QD1-2 illustrated in FIG. 5B is obtained. As a result of the analysis of the emission spectrum illustrated in FIG. 5B, it is confirmed that the quantum dot phosphor obtained in Comparative Preparation Example QD1-2 has an emission spectral peak wavelength of 515 nm and a half width of 35 nm.

Comparative Preparation Example QD1-3

Quantum Dot of Peak Wavelength 515 nm and Half Width 45 nm

A quantum dot phosphor comprising a CdSe/ZnS semiconductor nanoparticle is prepared in the same manner as Comparative Preparation Example QD1-1 by using the hot soap method. In the present comparative preparation example, the reaction time is 50 minutes, and classification is performed two times. Other conditions are the same as those of Preparation Example QD1-1.

Figure 5E:
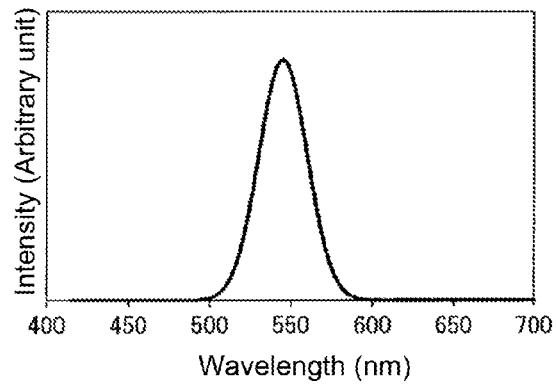
Figure 5C:
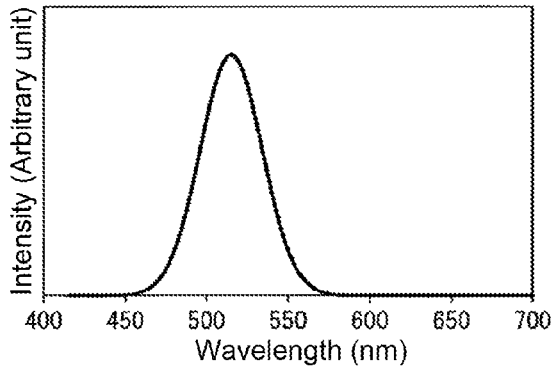

The emission spectrum of the quantum dot of Comparative Preparation Example QD1-3 is measured in the same manner as Preparation Example QD1-1. As a result, the emission spectrum of the quantum dot phosphor of Comparative Preparation Example QD1-3 illustrated in FIG. 5C is obtained. As a result of the analysis of the emission spectrum illustrated in FIG. 5C, it is confirmed that the quantum dot phosphor obtained in Comparative Preparation Example QD1-3 has an emission spectral peak wavelength of 515 nm and a half width of 45 nm.

Comparative Preparation Example QD2-1

Quantum Dot of Peak Wavelength 545 nm and Half Width 25 nm

A quantum dot phosphor comprising a CdSe/ZnS semiconductor nanoparticle is prepared in the same manner as Comparative Preparation Example QD1-1 by using the hot soap method. In the present comparative preparation example, the reaction time is 80 minutes, and classification is performed 10 times. Other conditions are the same as those of Preparation Example QD1-1.

The emission spectrum of the quantum dot of Comparative Preparation Example QD2-1 is measured in the same manner as Preparation Example QD1-1. As a result, the emission spectrum of the quantum dot phosphor of Comparative Preparation Example QD2-1 illustrated in FIG. 5D is obtained. As a result of the analysis of the emission spectrum illustrated in FIG. 5D, it is confirmed that the quantum dot phosphor obtained in Comparative Preparation Example QD2-1 has an emission spectral peak wavelength of 545 nm and a half width of 25 nm.

Comparative Preparation Example QD2-2

Quantum Dot of Peak Wavelength 545 nm and Half Width 35 nm

A quantum dot phosphor comprising a CdSe/ZnS semiconductor nanoparticle is prepared in the same manner as Comparative Preparation Example QD1-1 by using the hot soap method. In the present comparative preparation example, the reaction time is 80 minutes, and classification is performed five times. Other conditions are the same as those of Preparation Example QD1-1.

The emission spectrum of the quantum dot of Comparative Preparation Example QD2-2 is measured in the same manner as Preparation Example QD1-1. As a result, the emission spectrum of the quantum dot phosphor of Comparative Preparation Example QD2-2 illustrated in FIG. 5E is obtained. As a result of the analysis of the emission spectrum illustrated in FIG. 5E, it is confirmed that the quantum dot phosphor obtained in Comparative Preparation Example QD2-2 has an emission spectral peak wavelength of 545 nm and a half width of 35 nm.

Comparative Preparation Example QD2-3

Quantum Dot of Peak Wavelength 545 nm and Half Width 45 nm

A quantum dot phosphor comprising a CdSe/ZnS semiconductor nanoparticle is prepared in the same manner as Comparative Preparation Example QD1-1 by using the hot soap method. In the present comparative preparation example, the reaction time is 80 minutes, and classification is performed two times. Other conditions are the same as those of Preparation Example QD1-1.

Figure 5F:
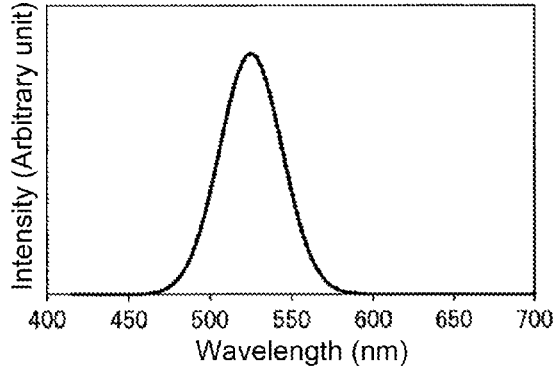
Figure 7A:
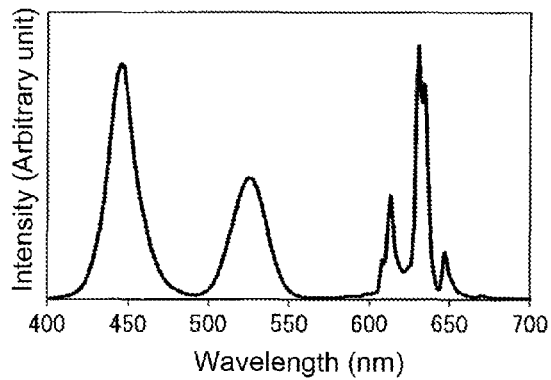
FIGS. 7A to 7F are graphs illustrating an emission spectrum of the light-emitting device according to the examples.
Figure 7D:
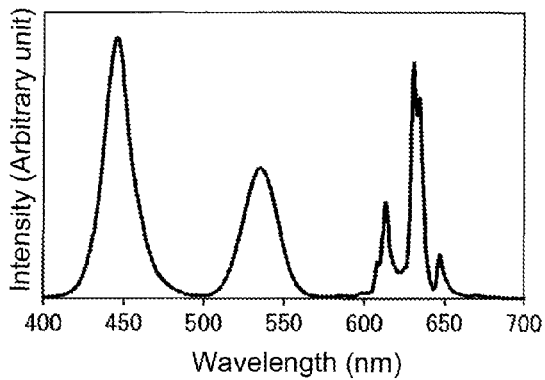
Figure 7B:
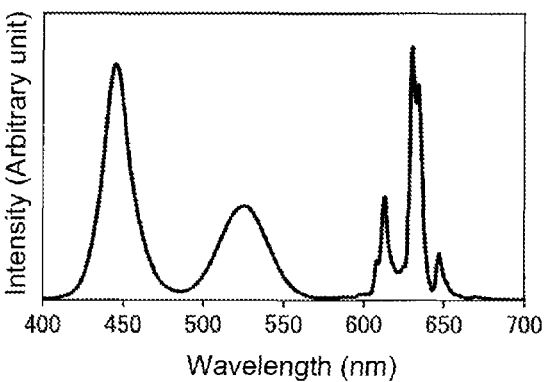
Figure 7E:
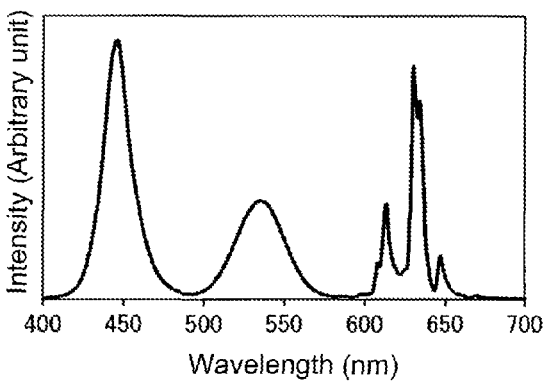
Figure 7C:
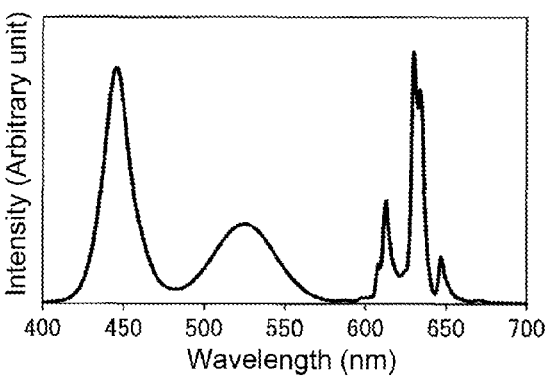
Figure 7F:
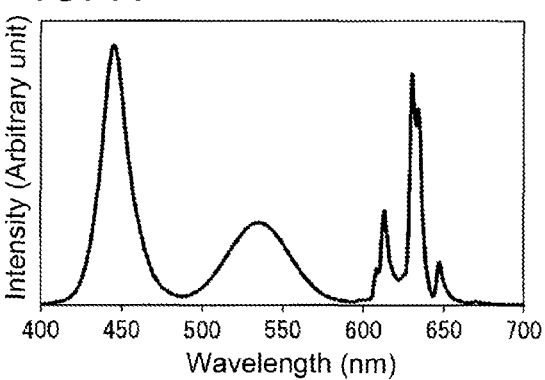
Figure 8A:
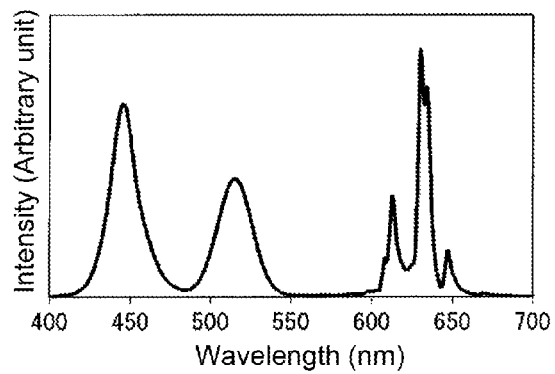
FIGS. 8A to 8F are graphs illustrating an emission spectrum of the light-emitting device according to the comparative examples.
Figure 8D:
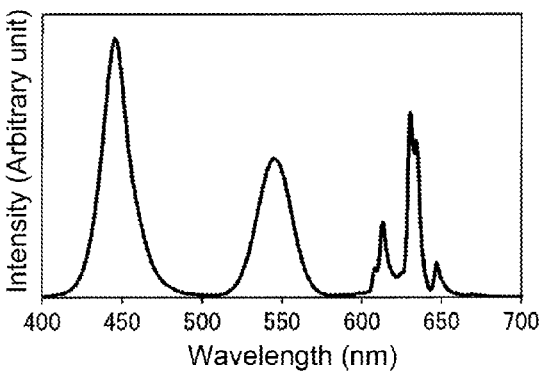
Figure 8B:
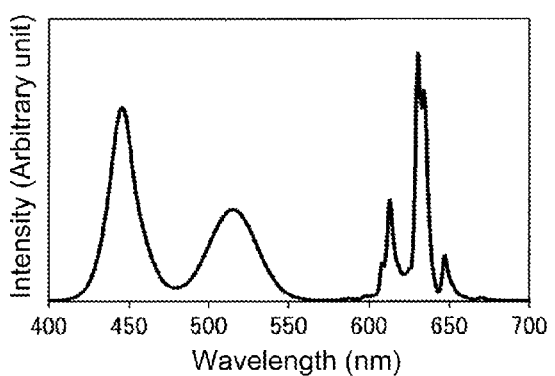
Figure 8E:
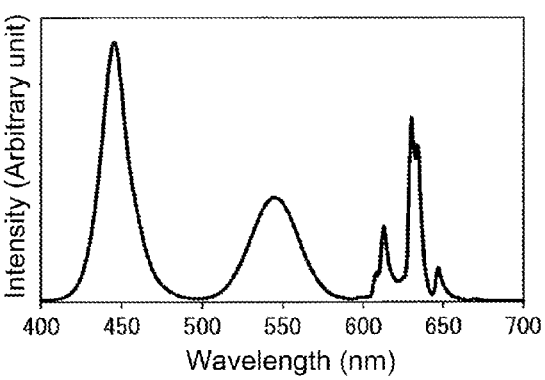
Figure 8C:
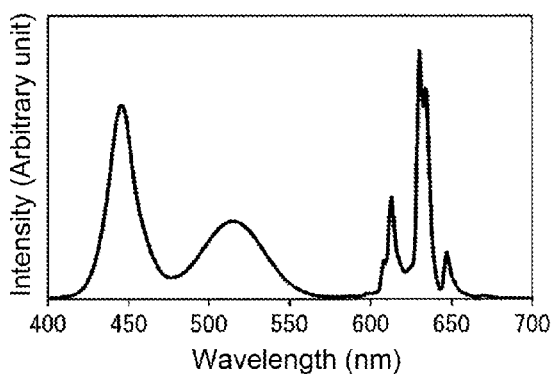
Figure 8F:
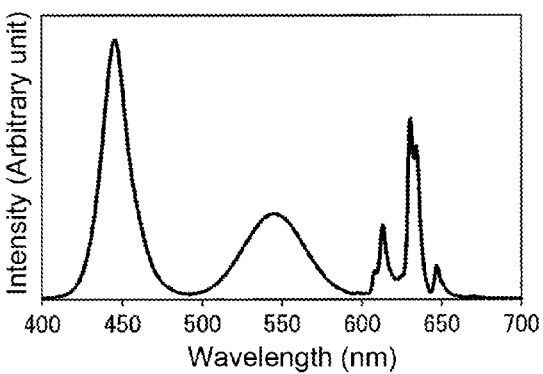

The emission spectrum of the quantum dot of Comparative Preparation Example QD2-3 is measured in the same manner as Preparation Example QD1-1. As a result, the emission spectrum of the quantum dot phosphor of Comparative Preparation Example QD2-3 illustrated in FIG. 5F is obtained. As a result of the analysis of the emission spectrum illustrated in FIG. 5F, it is confirmed that the quantum dot phosphor obtained in Comparative Preparation Example QD2-3 has an emission spectral peak wavelength of 545 nm and a half width of 45 nm.

Example and Comparative Example of Light-Emitting Device

Examples D1-1 to D1-3, Examples D2-1 to D2-3, Comparative Examples D1-1 to D1-3, and Comparative Examples D2-1 to D2-3 of the light-emitting device will be described with reference to FIG. 6 to FIG. 8F. FIG. 6 is a table illustrating parameters of the light-emitting device according to Examples D1-1 to D1-3, Examples D2-1 to D2-3, Comparative Examples D1-1 to D1-3, and Comparative Examples D2-1 to D2-3.

FIGS. 7A to 7F are graphs illustrating an emission spectrum of the light-emitting device according to Examples D1-1 to D1-3 and Examples D2-1 to D2-3 respectively. FIGS. 8A to 8F are graphs illustrating an emission spectrum of the light-emitting device according to Comparative Examples D1-1 to D1-3 and Comparative Examples D2-1 to D2-3 respectively.

The light-emitting element 11 is a blue LED with an emission peak wavelength of 445 nm (manufactured by Cree, Inc.) in Examples D1-1 to D1-3, Examples D2-1 to D2-3, Comparative Examples D1-1 to D1-3, and Comparative Examples D2-1 to D2-3. The red phosphor 12 is the $Mn^{4+}$ fluoride complex phosphor obtained in Preparation Example R1. The green phosphor 13 is one of the quantum dot phosphors obtained in each of the above preparation examples. The dispersion material 16 is a silicone resin (KER-2500 manufactured by Shin-Etsu Chemical Co., Ltd.).

Specifically, a procedure for preparing the light-emitting device according to the present example will be described in Example D1-1. First, a silicone resin and the $Mn^{4+}$ fluoride complex phosphor obtained in Preparation Example R1 are mixed to obtain a resin compound. The content of the $Mn^{4+}$ fluoride complex in the resin compound is 15.9 wt % given that the content of the silicone resin is 100 wt %.

Next, the quantum dot prepared in Preparation Example QD1-1 is dispersed into a toluene solution to obtain a quantum dot dispersed solution of which the concentration is adjusted to 5 wt %. The obtained quantum dot dispersed solution is mixed with the resin compound (silicone resin+red phosphor) by an amount of 10 wt % with respect to the 100 wt % resin compound.

The surrounding area of the blue LED is sealed by the phosphor dispersed resin. Then, the blue LED and the phosphor dispersed resin are heated at 80° C. for 30 minutes and at 120° C. for one hour to prepare a light-emitting device that has the same structure as the light-emitting device 10 illustrated in FIG. 1.

Examples D1-2 and D1-3, Examples D2-1 to D2-3, Comparative Examples D1-1 to D1-3, and Comparative Examples D2-1 to D2-3 have the same procedure for preparing the light-emitting device as Example D1-1. FIG. 6 may be referred to for the weight ratio of the $Mn^{4+}$ fluoride complex to the weight of the silicone resin and the weight ratio of the quantum dot phosphor to the weight of the silicone resin in each of the examples and comparative examples.

The light-emitting device obtained is driven at a drive current of 20 mA, and the emission spectrum thereof is measured by a spectrophotometer (MCPD-7000 manufactured by Otsuka Electronics Co., Ltd.) to obtain the emission spectra illustrated in FIGS. 7A to 7F and FIGS. 8A to 8F. Chromaticity coordinates are calculated from the obtained emission spectra to obtain the chromaticity coordinates illustrated in "light-emitting device chromaticity coordinate" of FIG. 6.

The amounts of the $Mn^{4+}$ fluoride complex phosphor and the quantum dot phosphor dispersed are adjusted in each of the examples and comparative examples such that white color is defined by a white point of around 10,000 K when the emission spectra illustrated in FIGS. 7A to 7F and in FIGS. 8A to 8F are transmitted through a liquid crystal panel described later.

Figure 9A:
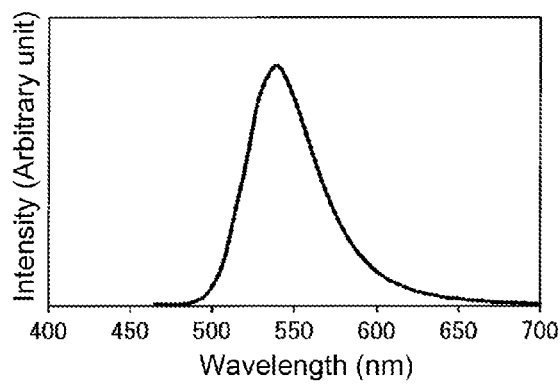
FIG. 9A is a graph illustrating an emission spectrum of a green phosphor according to another comparative example.
Figure 9B:
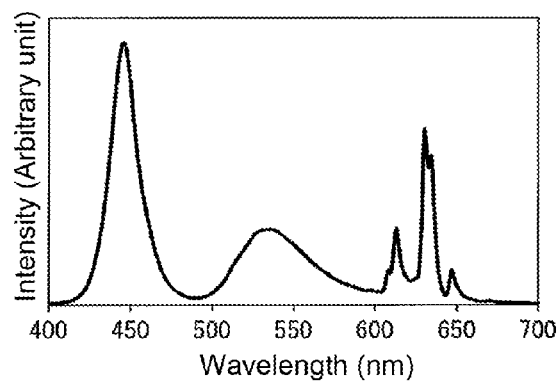
FIG. 9B is a graph illustrating an emission spectrum of a light-emitting device employing the green phosphor.

Another Comparative Preparation Example of Green Phosphor and Light-Emitting Device Another comparative preparation example for comparison with the green phosphor 13 and the light-emitting device of the present embodiment will be described with reference to FIGS. 9A and 9B. FIG. 9A is a graph illustrating an emission spectrum of a green phosphor according to the present comparative preparation example. FIG. 9B is a graph illustrating an emission spectrum of a light-emitting device employing the green phosphor of the present comparative preparation example.

Comparative Preparation Example B1

Preparation Example of Eu-Activated β-SiAlON

For comparison with the green phosphor of the present embodiment, an Eu-activated β-SiAlON phosphor in which Eu is activated by 0.10 at % in a material of a compositional formula of $Si_{6-z'}Al_{z'}O_{z'}N_{8-z'}$, where z'=0.06 is prepared in the following procedure.

First, as ingredient powders, metal Si that passed through a sieve of 45 μm, an aluminum nitride, and an europium oxide are weighed such that the weight ratio thereof is 93.59:5.02:1.39.

Next, the ingredient powder is mixed for 10 minutes or more by employing a mortar and a pestle made of a sintered silicon nitride to obtain a powder aggregate. Then, the powder aggregate is put into a crucible made of a boron nitride having a diameter of 20 mm and a height of 20 mm by gravity drop.

Next, the crucible is set in a pressurized electric furnace of a graphite resistance heating type. Then, a vacuum is made in the pressurized electric furnace by a diffusion pump for a firing atmosphere, and the crucible is heated from room temperature to 800° C. at a temperature rise rate of 500° C. per hour. Then, nitrogen having purity of 99.999 vol % is introduced into the pressurized electric furnace at 800° C. to set the pressure to 0.5 MPa. Then, the crucible is heated to 1,300° C. at a temperature rise rate of 500° C. per hour.

Then, the crucible is heated to 1,600° C. at a temperature rise rate of 1° C. per minute, and the temperature is maintained at 1,600° C. for eight hours. The sample synthesized by the process thus far is pulverized in a mortar made of agate to obtain a powder sample.

Next, the powder is reheated. First, the powder fired at 1600° C. is pulverized by employing a mortar and a pestle made of a silicon nitride. Then, the powder is put into a crucible made of a boron nitride having a diameter of 20 mm and a height of 20 mm by gravity drop.

Next, the crucible is set in a pressurized electric furnace of a graphite resistance heating type. Then, a vacuum is made in the pressurized electric furnace by a diffusion pump for a firing atmosphere, and the crucible is heated from room temperature to 800° C. at a temperature rise rate of 500° C. per hour. Then, nitrogen having a purity of 99.999 vol % is introduced into the pressurized electric furnace at 800° C. to set the pressure to 1 MPa. Then, the crucible is heated to 1,900° C. at a temperature rise rate of 500° C. per hour, and the temperature is maintained at 1,900° C. for eight hours. As result, a phosphor sample is obtained.

Then, the phosphor sample obtained is pulverized in a mortar made of agate and is further processed at a temperature of 60° C. in an acid including a 1:1 mixture of 50% hydrofluoric acid and 70% nitric acid to obtain phosphor powder.

Next, an X-ray diffraction measurement is performed on the phosphor powder in the same manner as Preparation Example R1. As a result, it is confirmed that the phosphor powder has a β-SiAlON structure.

The emission spectrum of the Eu-activated β-SiAlON phosphor of Comparative Preparation Example B1 is measured in the same manner as Preparation Example R1. As a result, the emission spectrum of the Eu-activated β-SiAlON phosphor of Comparative Preparation Example B1 illustrated in FIG. 9A is obtained. In FIG. 9A, the emission spectrum of the Eu-activated β-SiAlON phosphor of Comparative Preparation Example B1 has a peak wavelength of 539 nm and a half width of 51 nm.

Comparative Example B1

A silicone resin, the $Mn^{4+}$ fluoride complex phosphor obtained in Preparation Example R1, and the Eu-activated β-SiAlON phosphor obtained in Comparative Preparation Example B1 are mixed together to obtain a phosphor dispersed resin. Given that the content of the silicone resin is 100 wt %, the content of the $Mn^{4+}$ fluoride complex is set to 10.2 wt %, and the content of the Eu-activated β-SiAlON phosphor is set to 5.6 wt %.

Next, a blue LED of an emission peak wavelength of 445 nm (manufactured by Cree, Inc.) is prepared, and the surrounding area thereof is sealed by the phosphor dispersed resin obtained above. Then, the blue LED and the phosphor dispersed resin are heated at 80° C. for 30 minutes and at 150° C. for one hour to prepare a light-emitting device that has the same structure as FIG. 1.

The light-emitting device obtained is driven at a drive current of 20 mA to obtain the emission spectrum illustrated in FIG. 9B. The CIE 1931 chromaticity coordinates (CIEx, CIEy)=(0.261, 0.229) are calculated from the obtained emission spectrum.

Employing the light-emitting device 10 as backlight of an image display can realize an image display that has a high luminous efficiency and a wide color reproduction range. Details will be described in a second embodiment.

Second Embodiment

The second embodiment will be described as follows on the basis of FIG. 10 at (a) to FIG. 14. In the present embodiment, an image display including the light-emitting device of the first embodiment will be described. For convenience of description, members having the same function as the members described in the first embodiment will be designated by the same reference characters and will not be described here.

Image Display 100

Figure 10:
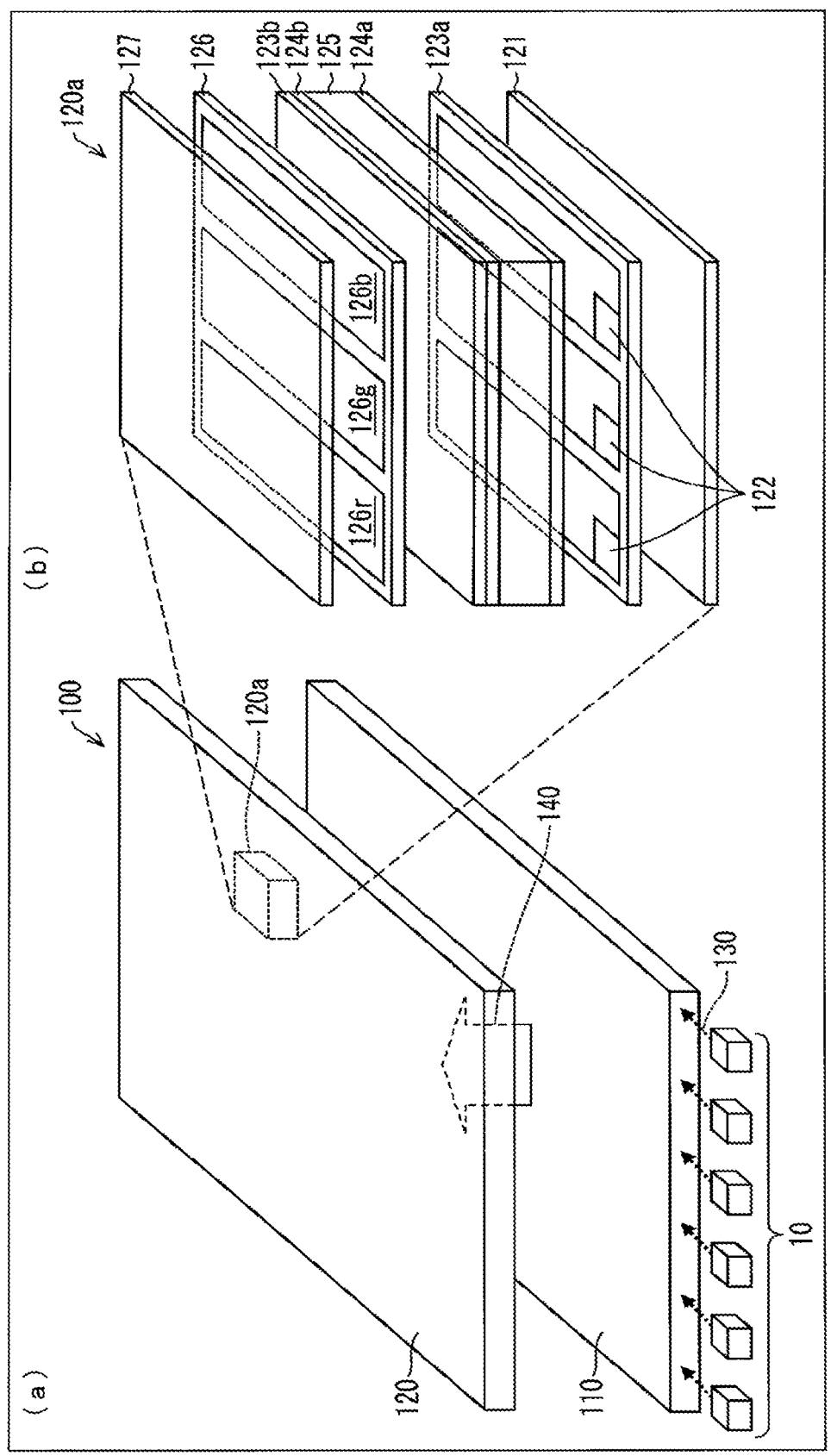
FIG. 10 at (a) is an exploded perspective view of an image display according to a second embodiment, and FIG. 10 at (b) is an exploded perspective view of a liquid crystal display included in the image display illustrated in FIG. 10 at (a)
Figure 11:
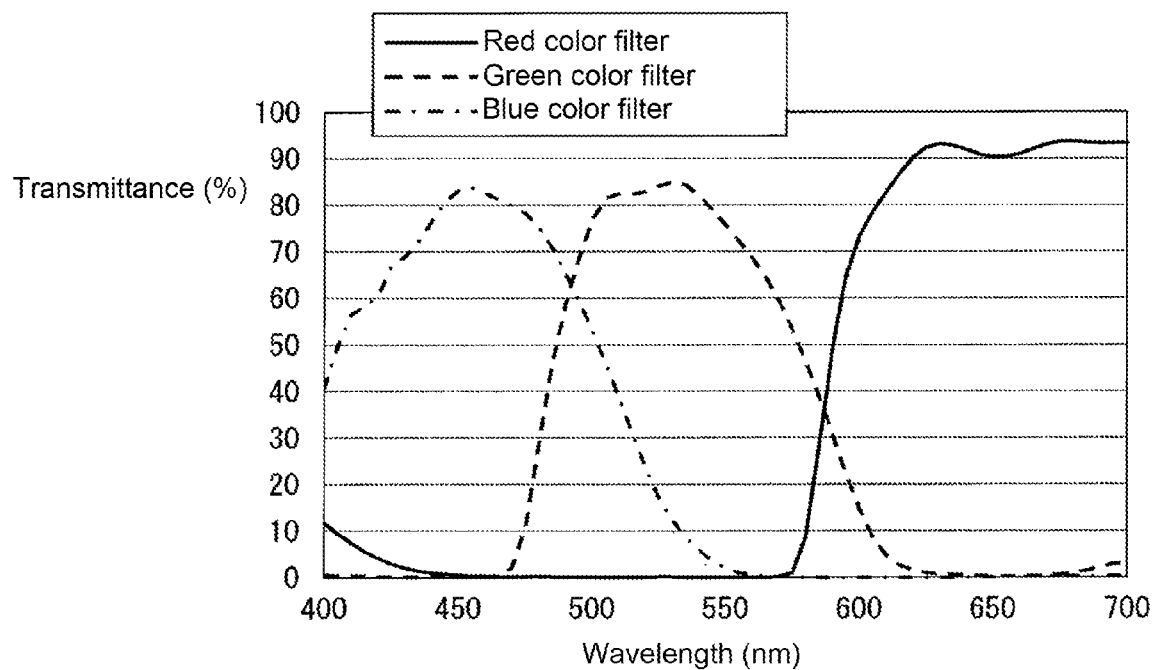
FIG. 11 is a graph illustrating the transmission spectra of color filters.
Figure 13A:
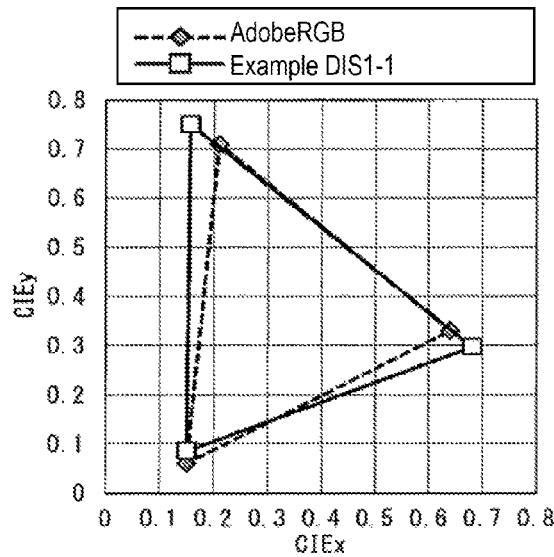
FIGS. 13A to 13D are graphs for comparison between the Adobe RGB color gamut and the color gamut of the image display of each of the examples and comparative examples.
Figure 13C:
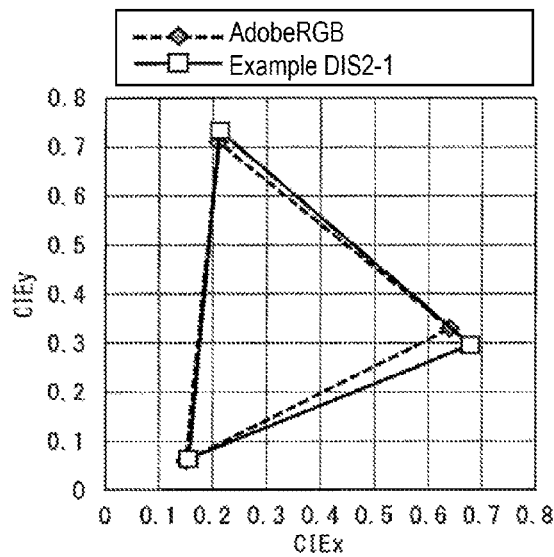
Figure 13B:
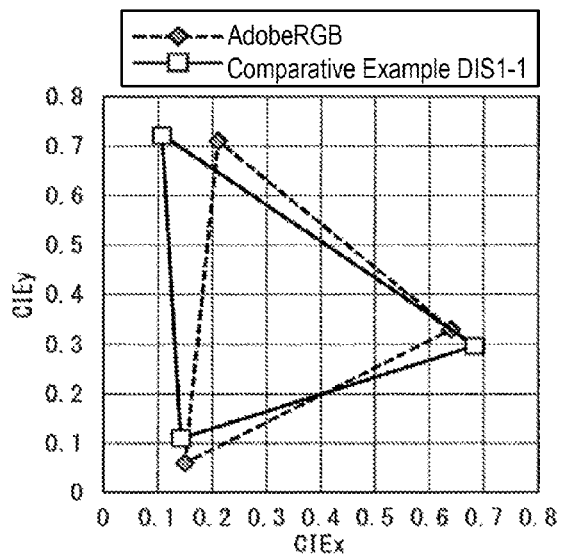
Figure 13D:
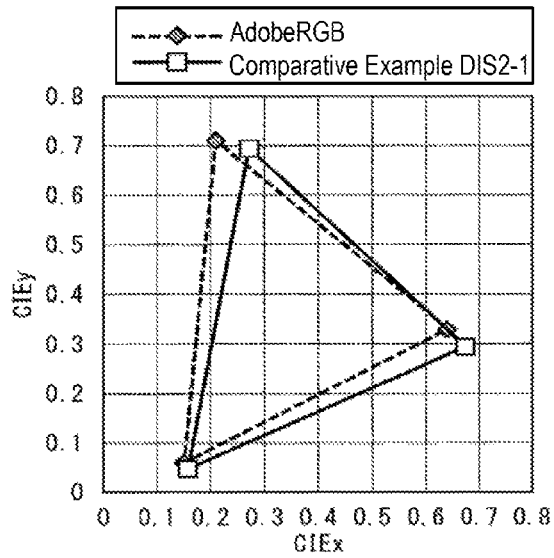

FIG. 10 at (a) is an exploded perspective view of an image display 100 that is an example of the image display of the present embodiment. FIG. 10 at (b) is an exploded perspective view of a liquid crystal display 120a included in the image display 100 illustrated in FIG. 10 at (a). FIG. 11 is a graph illustrating transmission spectra of color filters included in the image display 100.

As illustrated in FIG. 10 at (a), the image display 100 includes the light-emitting device 10, a light guide plate 110, and a liquid crystal display unit 120. The light guide plate 110 is a light guide plate that is either transparent or semi-transparent. The liquid crystal display unit 120 is a display unit displaying images and includes a plurality of liquid crystal displays 120a.

The light-emitting device 10 is arranged in plural quantities on a side surface of the light guide plate 110 in the image display 100. The liquid crystal display unit 120 is disposed adjacent to the light guide plate 110. Emitted light 130 from the light-emitting device 10 is configured to be scattered inside the light guide plate 110 to be the scattered light 140 with which the entire surface of the liquid crystal display unit 120 is irradiated.

As illustrated in FIG. 10 at (b), the liquid crystal display 120a constituting the liquid crystal display unit 120 includes a laminate of, in this order, a polarization plate 121, a transparent conductive film 123a (includes thin-film transistors 122), an orientation film 124a, a liquid crystal layer 125, an orientation film 124b, an upper thin-film electrode 123b, a color filter 126 for displaying color pixels, and an upper polarization plate 127.

The color filter 126 is divided into parts having sizes corresponding to the sizes of each pixel of the transparent conductive film 123a. The color filter 126 includes a red color filter 126r transmitting red light, a green color filter 126g transmitting green light, and a blue color filter 126b transmitting blue light.

It is desirable that the image display 100 according to the present embodiment includes filters respectively transmitting red light, green light, and blue light as the color filter 126 illustrated in FIG. 10 at (b). In this case, for example, color filters respectively exhibiting the transmission spectra illustrated in FIG. 11 can be suitably employed. The color filters exhibiting the transmission spectra illustrated in FIG. 11 are also employed in the example described below.

Example of Image Display

Examples and Comparative Examples of preparation of an image display having the structures illustrated in FIG. 10 will be described below. FIG. 12 is a table illustrating parameters of the image display according to each of the examples and comparative examples.

The light-emitting device of each example according to the first embodiment is employed with combinations illustrated in FIG. 12 as a backlight source of the image display of each of the examples and comparative examples. Color filters exhibiting the transmittances illustrated in FIG. 11 are employed as the color filters of the image display.

Comparison of Color Reproduction Range of Image Display

FIG. 12 illustrates the CIE 1931 chromaticity coordinates of a white point, a red point, a green point, and a blue point of light displayed on a screen and the Adobe RGB coverage of the image display of each of the examples and comparative examples.

The red point, the green point, and the blue point are chromaticity points on a display when light transmitted through each of the red color filter, the green color filter, and the blue color filter is displayed separately on the display. The white point is a chromaticity point on the display when light transmitted through each color filter is displayed together at the same time. The Adobe RGB coverage is the proportion of the area covered by the color gamut formed by the red point, the green point, and the blue point to the area of the Adobe RGB color gamut.

The chromaticity points and the Adobe RGB coverage illustrated in FIG. 12 are calculated from spectrum data that is measured by employing MCPD-7000 manufactured by Otsuka Electronics Co., Ltd.

From the parameters of each of the examples and comparative examples illustrated in FIG. 12, it is understood that the image display of each example has a higher Adobe RGB coverage than the image display of each comparative example. This is because the emission peak wavelength of the green phosphor comprising the quantum dot employed in the present disclosure is set to be suitable in combination with the $Mn^{4+}$-activated phosphor.

The above effect will be described by employing FIGS. 13A to 13D. FIGS. 13A to 13D are graphs for comparison between the Adobe RGB color gamut and the color gamut of the image display of Example DIS1-1, Example DIS2-1, Comparative Example DIS1-1, and Comparative Example DIS2-1.

The color gamut around (CIEx, CIEy)=(0.2, 0.7) is the green color gamut in each of FIGS. 13A to 13D. From comparisons between FIGS. 13A and 13C and between FIGS. 13B and 13D, it is understood that the image display of Example DIS1-1 and Example DIS2-1 has a green color gamut that matches the Adobe RGB color gamut better than the image display of Comparative Example DIS1-1 and Comparative Example DIS2-1.

Comparison of Brightness of Image Display

A comparison is made between the brightness of the image display of each example and the brightness of the image display of Comparative Examples DIS1-1 to DIS1-3. The brightness of the image display of each of the example and Comparative Examples DIS1-1 to DIS1-3 is measured with a spectrophotometer installed in the liquid crystal display unit of the image display while light transmitted through each color filter is displayed together at the same time.

As described in the first embodiment, the amounts of the red phosphor and the green phosphor dispersed are adjusted such that white color is defined by a white point of around 10,000 K in the light-emitting device employed in the image display of each of the examples and comparative examples. Therefore, the following data includes a comparison of the brightness in a white color of around 10,000 K of the image display of each of the examples and comparative examples.

FIG. 14 is a table illustrating the brightness of the image display of the examples and the comparative examples. As illustrated in FIG. 14, it is understood that the image display of each example has a higher brightness than the image display of Comparative Examples DIS1-1 to DIS1-3.

In the image display of each comparative example, the peak wavelength of green light emitted by the light-emitting device included in the image display is separated from the peak wavelength of the visibility of a human being (refer to FIG. 2). On the other hand, in the image display of each example, the peak wavelength of green light emitted by the light-emitting device included in the image display is close to the peak wavelength of the visibility curve of a human being.

Thus, the image display of each example can realize a higher luminous efficiency than the image display of each comparative example.

As is apparent from the above comparison of the color reproduction range and the comparison of the brightness on the screen, according to the image display of the present embodiment, an image display having a high luminous efficiency and color reproducibility can be realized.

Third Embodiment

A third embodiment will be described. The third embodiment is another embodiment of the light-emitting device described in the first embodiment. The light-emitting device according to the present embodiment is the same as the light-emitting device 10 except for the light-emitting element 11 and thus will not be described here.

In the light-emitting device according to the present embodiment, the peak wavelength of the primary light (excitation light) emitted from the light-emitting element is greater than or equal to 420 nm and less than or equal to 440 nm. Even with the light-emitting element emitting the primary light (excitation light) of such a peak wavelength, it is possible to provide a light-emitting device that enables realization of an image display having a wide color reproduction range.

However, the light-emitting device 10 of the first embodiment, since having a favorable peak wavelength of the primary light (excitation light) and favorable wavelength consistency between the excitation spectrum of the red phosphor 12 and the transmission spectrum of the blue color filter 126$b$ as described above, has a higher luminous efficiency than the light-emitting device of the present embodiment.

Fourth Embodiment

A fourth embodiment will be described. The fourth embodiment is another embodiment of the light-emitting device described in the first embodiment. The light-emitting device according to the present embodiment is the same as the light-emitting device 10 except for the green phosphor 13 and thus will not be described here.

The light-emitting device according to the present embodiment does not employ the CdSe/ZnS semiconductor nanoparticle but employs a commercially available InP-based quantum dot having an emission spectral peak wavelength of 525 nm and a half width of 65 nm for the green phosphor 13.

The InP-based quantum dot has a wider emission spectral half width than the CdSe/ZnS semiconductor nanoparticle. Thus, an image display employing the light-emitting device of the present embodiment has lower color reproducibility than the image display employing the light-emitting device 10.

The InP-based quantum dot does not include Cd. Therefore, the light-emitting device of the present embodiment has the advantage of having a smaller environmental load than the light-emitting device 10.

CONCLUSION

A light-emitting device (10) according to a first aspect of the present disclosure includes a light-emitting element (11) emitting blue light, a quantum dot phosphor (green phosphor 13) emitting green light when being excited by the blue light, and an $Mn^{4+}$-activated fluoride complex phosphor (red phosphor 12) emitting red light when being excited by the blue light. The emission spectral peak wavelength of the green light emitted by the quantum dot phosphor is greater than or equal to 520 nm and less than or equal to 540 nm.

According to this configuration, the light-emitting device emits the blue light emitted by the light-emitting element, the green light emitted by the quantum dot phosphor when being excited by the blue light, and the red light emitted by the $Mn^{4+}$-activated fluoride complex phosphor when being excited by the blue light. The peak wavelength of the green light is greater than or equal to 520 nm and less than or equal to 540 nm.

The color reproducibility of an image display, such as the coverage with respect to the Adobe RGB color gamut, decreases when the peak wavelength of the green light is less than 520 nm or exceeds 540 nm. That is, if the peak wavelength of the green light is greater than or equal to 520 nm and less than or equal to 540 nm, the color reproducibility of the image display including the light-emitting device of the present disclosure increases.

Therefore, the effect of providing a light-emitting device enabling realization of an image display having a wide color reproduction range can be accomplished.

In a light-emitting device according to a second aspect of the present disclosure, it is desirable that the half width of the green light in the first aspect is greater than or equal to 25 nm.

According to this configuration, the allowable range of size variation of the quantum dot phosphor emitting the green light is widened. Therefore, the effect of increasing the yield of the quantum dot phosphor is accomplished.

In a light-emitting device according to a third aspect of the present disclosure, it is desirable that the half width of the red light in the first or second aspect is less than or equal to 10 nm.

According to this configuration, the half width of the red light is very narrow, less than or equal to 10 nm. Therefore, the effect of increasing the color reproducibility of the image display including the light-emitting device of the present disclosure is accomplished.

It is desirable that a light-emitting device according to a fourth aspect of the present disclosure further includes, in addition to any one of the first to third aspects, a dispersion material (16) sealing the light-emitting element and that the quantum dot phosphor and the $Mn^{4+}$-activated fluoride complex phosphor are dispersed into the dispersion material.

According to this configuration, the quantum dot phosphor and the $Mn^{4+}$-activated fluoride complex phosphor are dispersed into one single dispersion material sealing the light-emitting element.

In a case where the red light emitting phosphor is a quantum dot phosphor, when a phosphor emitting green light is dispersed into the same dispersion material as the phosphor emitting red light, the red light emitting phosphor absorbs the green light emitted by the green light emitting phosphor. This poses a problem in that the luminous efficiency of the light-emitting device decreases remarkably.

On the other hand, the $Mn^{4+}$-activated fluoride complex phosphor does not absorb green light. Thus, the above problem does not arise even if the green light emitting phosphor is dispersed into the same dispersion material as the $Mn^{4+}$-activated fluoride complex phosphor. Therefore, the effect of simplifying the structure of the light-emitting device can be accomplished.

In a light-emitting device according to a fifth aspect of the present disclosure, it is desirable that the dispersion material in the fourth aspect comprises a transparent resin material.

According to this configuration, since the dispersion material is comprises a transparent resin material, the effect of preparing the dispersion material at a lower temperature than in a case where the dispersion material comprises glass, quartz, or the like can be accomplished.

In a light-emitting device according to a sixth aspect of the present disclosure, it is desirable that the quantum dot phosphor in any of the first to fifth aspects includes at least one of CdSe, CdS, CdTe, InP, InN, AlInN, InGaN, AlGaInN, and CuInGaSe.

According to this configuration, the quantum dot phosphor can be configured by employing a material capable of emitting visible light efficiently.

In a light-emitting device according to a seventh aspect of the present disclosure, the $Mn^{4+}$-activated fluoride complex phosphor in any of the first to sixth aspects may be represented by a general formula $MI_2(MII_{1-h}Mn_h)F_6$ where MI includes at least one alkaline metal element of Li, Na, K, Rb, and Cs, MII includes at least one tetravalent metal element of Ge, Si, Sn, Ti, and Zr, and h is greater than or equal to 0.001 and less than or equal to 0.1.

According to this configuration, h defines a suitable concentration of $Mn^{4+}$ ions neither excessively nor insufficiently. Therefore, the effect of the $Mn^{4+}$-activated fluoride complex phosphor having a high luminous intensity is accomplished.

In a light-emitting device according to an eighth aspect of the present disclosure, it is desirable that the $Mn^{4+}$-activated fluoride complex phosphor in the seventh aspect is $K_2(Si_{1-h}Mn_h)F_6$.

According to this configuration, the effect of the $Mn^{4+}$-activated fluoride complex phosphor having (i) a high luminous intensity, (ii) high stability of the phosphor crystal, and (iii) high water-resistance is accomplished.

In a light-emitting device according to a ninth aspect of the present disclosure, the $Mn^{4+}$-activated fluoride complex phosphor in any of the first to sixth aspects may be represented by a general formula $MIII(MII_{1-h}Mn_h)F_6$ where MIII includes at least one alkaline earth metal element of Mg, Ca, Sr, and Ba, MII includes at least one tetravalent metal element of Ge, Si, Sn, Ti, and Zr, and h is greater than or equal to 0.001 and less than or equal to 0.1.

According to this configuration, h defines a suitable concentration of $Mn^{4+}$ ions neither excessively nor insufficiently in the same manner as the seventh aspect. Therefore, the effect of the $Mn^{4+}$-activated fluoride complex phosphor having a high luminous intensity is accomplished.

In a light-emitting device according to a tenth aspect of the present disclosure, it is desirable that the $Mn^{4+}$-activated fluoride complex phosphor in the ninth aspect is $Ba(Si_{1-h}Mn_h)F_6$.

According to this configuration, the effect of the $Mn^{4+}$-activated fluoride complex phosphor having (i) a high luminous intensity, (ii) less degradation due to heat and external forces, and (iii) high water-resistance is accomplished.

In a light-emitting device according to an eleventh aspect of the present disclosure, it is desirable that the peak wavelength of the blue light in any one of the first to tenth aspects is greater than or equal to 420 nm and less than or equal to 480 nm.

According to this configuration, the light-emitting element has a high luminous efficiency, and thus the luminous efficiency of the light-emitting device can be increased.

In a light-emitting device according to a twelfth aspect of the present disclosure, it is desirable that the peak wavelength of the blue light in the eleventh aspect is greater than or equal to 440 nm and less than or equal to 460 nm.

According to this configuration, the light-emitting element has a particularly high luminous efficiency, and favorable wavelength consistency is attained between the excitation spectrum of the red phosphor and the transmission spectrum of the blue color filter. Thus, the luminous efficiency of the light-emitting device can be further increased.

An image display (100) according to a thirteenth aspect of the present disclosure includes the light-emitting device of any one of the first to twelfth aspects.

According to this configuration, the effect of providing an image display having high color reproducibility can be accomplished.

The present disclosure is not limited to each embodiment described above. Various modifications can be carried out within the scope of the claims. In addition, an embodiment obtained by appropriately combining technical units disclosed in each different embodiment also falls within the technical scope of the present disclosure. Furthermore, new technical features can be formed by combining technical units disclosed in each embodiment.

Another Representation of Present Disclosure

The present disclosure can also be represented as follows.

That is, a semiconductor light-emitting device according to an aspect of the present disclosure includes a semiconductor light-emitting element emitting blue light, a quantum dot phosphor emitting green light when being excited by the blue light, and an $Mn^{4+}$-activated fluoride complex phosphor emitting red light when being excited by the blue light. The emission spectral peak wavelength of the green light ranges inclusively from 520 nm to 540 nm, and the half width thereof is greater than or equal to 25 nm. The emission spectral half width of the red light is less than or equal to 10 nm.

In the semiconductor light-emitting device according to an aspect of the present disclosure, the semiconductor light-emitting element is sealed by a dispersion material into which the quantum dot phosphor and the $Mn^{4+}$-activated fluoride complex phosphor are dispersed.

In the semiconductor light-emitting device according to an aspect of the present disclosure, the dispersion material is a transparent member comprising a resin material.

In the semiconductor light-emitting device according to an aspect of the present disclosure, the material constituting the quantum dot phosphor includes CdSe, CdS, and CdTe.

In the semiconductor light-emitting device according to an aspect of the present disclosure, the material constituting the quantum dot phosphor includes InP, InN, AlInN, InGaN, AlGaInN, and CuInGaSe.

In the semiconductor light-emitting device according to an aspect of the present disclosure, the $Mn^{4+}$-activated fluoride complex phosphor is $MI_2(MII_{1-h}Mn_h)F_6$ (where MI is at least one alkaline metal element selected from a group consisting of Li, Na, K, Rb, and Cs, MII is at least one tetravalent metal element selected from a group consisting of Ge, Si, Sn, Ti, and Zr, and $0.001 \leq h \leq 0.1$).

In the semiconductor light-emitting device according to an aspect of the present disclosure, the $Mn^{4+}$-activated fluoride complex phosphor is $K_2(Si_{1-h}Mn_h)F_6$ (where $0.001 \leq h \leq 0.1$).

An image display according to an aspect of the present disclosure employs the semiconductor light-emitting device of any aspect described above.

The present disclosure can be employed in any light-emitting device employing a phosphor converting excitation light into fluorescence and in any image display employing the light-emitting device.

The present disclosure contains subject matter related to that disclosed in Japanese Priority Patent Application JP 2015-087081 filed in the Japan Patent Office on Apr. 21, 2015, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-emitting device comprising:
a light-emitting element that emits blue light;
a quantum dot phosphor that emits green light when being excited by the blue light; and
an $Mn^{4+}$-activated fluoride complex phosphor that emits red light when being excited by the blue light,
wherein an emission spectral peak wavelength of the green light emitted by the quantum dot phosphor is greater than or equal to 520 nm and less than or equal to 540 nm, and wherein the $Mn^{4+}$-activated fluoride complex phosphor lacks significant excitation at 520 nm and longer wavelengths.

2. The light-emitting device according to claim 1,
wherein an emission spectral half width of the green light is greater than or equal to 25 nm.

3. The light-emitting device according to claim 1,
wherein an emission spectral half width of the red light is less than or equal to 10 nm.

4. The light-emitting device according to claim 1, further comprising:
a dispersion material that seals the light-emitting element,
wherein the quantum dot phosphor and the $Mn^{4+}$-activated fluoride complex phosphor are dispersed into the dispersion material.

5. The light-emitting device according to claim 4,
wherein the dispersion material comprises a transparent resin material.

6. The light-emitting device according to claim 1,
wherein the quantum dot phosphor includes at least one of CdSe, CdS, CdTe, InP, InN, AlInN, InGaN, AlGaInN, and CuInGaSe.

7. The light-emitting device according to claim 1,
wherein the $Mn^{4+}$-activated fluoride complex phosphor is represented by a general formula $MI_2(MII_{1-h}Mn_h)F_6$,
in the general formula, MI includes at least one alkaline metal element selected from the group consisting of Li, Na, K, Rb, and Cs,
MII includes at least one tetravalent metal element selected from the group consisting of Ge, Si, Sn, Ti, and Zr, and
h is greater than or equal to 0.001 and less than or equal to 0.1.

8. The light-emitting device according to claim 7,
wherein the $Mn^{4+}$-activated fluoride complex phosphor is $K_2(Si_{1-h}Mn_h)F_6$.

9. The light-emitting device according to claim 1,
wherein a peak wavelength of the blue light is greater than or equal to 420 nm and less than or equal to 480 nm.

10. The light-emitting device according to claim 9,
wherein the peak wavelength of the blue light is greater than or equal to 440 nm and less than or equal to 460 nm.

11. An image display comprising:
the light-emitting device according to claim 1.

12. A light-emitting device comprising:
a light-emitting element that emits blue light;
a quantum dot phosphor that emits green light when being excited by the blue light; and
an $Mn^{4+}$-activated fluoride complex phosphor that emits red light when being excited by the blue light,
wherein an emission spectral peak wavelength of the green light emitted by the quantum dot phosphor is greater than or equal to 520 nm and less than or equal to 540 nm, and
wherein the $Mn^{4+}$-activated fluoride complex phosphor is represented by a general formula $MIII(MII_{1-h}Mn_h)F_6$,
in the general formula, MIII includes at least one alkaline earth metal element selected from the group consisting of Mg, Ca, Sr, and Ba,
MII includes at least one tetravalent metal element selected from the group consisting of Ge, Si, Sn, Ti, and Zr, and
h is greater than or equal to 0.001 and less than or equal to 0.1.

13. The light-emitting device according to claim 12,
wherein the $Mn^{4+}$-activated fluoride complex phosphor is $Ba(Si_{1-h}Mn_h)F_6$.

* * * * *